(12) United States Patent
Xin

(10) Patent No.: US 7,237,183 B2
(45) Date of Patent: Jun. 26, 2007

(54) PARALLEL DECODING OF A BCH ENCODED SIGNAL

(75) Inventor: Weizhuang Wayne Xin, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 428 days.

(21) Appl. No.: 10/704,954

(22) Filed: Nov. 10, 2003

(65) Prior Publication Data

US 2004/0177312 A1 Sep. 9, 2004

(51) Int. Cl.
*H03M 13/00* (2006.01)

(52) U.S. Cl. ..................... 714/782; 714/785
(58) Field of Classification Search ............... 714/781, 714/782, 785; 365/230.03
See application file for complete search history.

(56) References Cited

U.S. PATENT DOCUMENTS

| | | | | |
|---|---|---|---|---|
| 5,297,153 A * | 3/1994 | Baggen et al. | ............... | 714/782 |
| 6,374,383 B1 * | 4/2002 | Weng | ........................ | 714/781 |
| 6,560,747 B1 * | 5/2003 | Weng | ........................ | 714/781 |
| 6,637,002 B1 * | 10/2003 | Weng et al. | ................. | 714/781 |
| 6,639,865 B2 * | 10/2003 | Kwon | ................... | 365/230.03 |
| 6,704,902 B1 * | 3/2004 | Shinbashi et al. | .......... | 714/785 |
| 6,792,569 B2 * | 9/2004 | Cox et al. | ................... | 714/781 |
| 7,010,739 B1 * | 3/2006 | Feng et al. | ................. | 714/784 |

* cited by examiner

*Primary Examiner*—Guy Lamarre
*Assistant Examiner*—Esaw T. Abraham
(74) *Attorney, Agent, or Firm*—Garlick Harrison & Markison; Timothy W. Markison; Kevin L. Smith

(57) ABSTRACT

A method or apparatus for error identification of a BCH encoded signal includes processing that begins by receiving a BCH encoded signal in a binary polynomial format to produce a received polynomial. The processing then continues by converting the received polynomial into a plurality of error identifying polynomials. The processing then continues by recursively processing the plurality of binary error identifying polynomials to produce a plurality of error identifying values. The processing then continues by processing the plurality of error identifying values to produce an error locator polynomial that represents error in the received polynomial. The processing then continues by evaluating the error locator polynomial to identify the bit location of the error in the BCH encoded signal. The processing then continues by correcting the BCH encoded signal based on the bit location of the error.

34 Claims, 15 Drawing Sheets

| 000 0000 | 001 0000 | 010 0000 | 011 0000 | 100 0000 | 101 0000 | 110 0000 | 111 0000 |
| 000 0001 | 001 0001 | 010 0001 | 011 0001 | 100 0001 | 101 0001 | 110 0001 | 111 0001 |
| 000 0010 | 001 0010 | 010 0010 | 011 0010 | 100 0010 | 101 0010 | 110 0010 | 111 0010 |
| 000 0011 | 001 0011 | 010 0011 | 011 0011 | 100 0011 | 101 0011 | 110 0011 | 111 0011 |
| 000 0100 | 001 0100 | 010 0100 | 011 0100 | 100 0100 | 101 0100 | 110 0100 | 111 0100 |
| 000 0101 | 001 0101 | 010 0101 | 011 0101 | 100 0101 | 101 0101 | 110 0101 | 111 0101 |
| 000 0110 | 001 0110 | 010 0110 | 011 0110 | 100 0110 | 101 0110 | 110 0110 | 111 0110 |
| 000 0111 | 001 0111 | 010 0111 | 011 0111 | 100 0111 | 101 0111 | 110 0111 | 111 0111 |
| 000 1000 | 001 1000 | 010 1000 | 011 1000 | 100 1000 | 101 1000 | 110 1000 | 111 1000 |
| 000 1001 | 001 1001 | 010 1001 | 011 1001 | 100 1001 | 101 1001 | 110 1001 | 111 1001 |
| 000 1010 | 001 1010 | 010 1010 | 011 1010 | 100 1010 | 101 1010 | 110 1010 | 111 1010 |
| 000 1011 | 001 1011 | 010 1011 | 011 1011 | 100 1011 | 101 1011 | 110 1011 | 111 1011 |
| 000 1100 | 001 1100 | 010 1100 | 011 1100 | 100 1100 | 101 1100 | 110 1100 | 111 1100 |
| 000 1101 | 001 1101 | 010 1101 | 011 1101 | 100 1101 | 101 1101 | 110 1101 | 111 1101 |
| 000 1110 | 001 1110 | 010 1110 | 011 1110 | 100 1110 | 101 1110 | 110 1110 | 111 1110 |
| 000 1111 | 001 1111 | 010 1111 | 011 1111 | 100 1111 | 101 1111 | 110 1111 | 111 1111 |

FIG. 2
prior art 16 codewords of a (7,4) code block
n ← k

| 000 0000 | 110 1000 |
| 101 0001 | 011 1001 |
| 111 0010 | 001 1010 |
| 010 0011 | 100 1011 |
| 010 0100 | 101 1100 |
| 011 0101 | 000 1101 |
| 110 0110 | 010 1110 |
| 100 0111 | 111 1111 |
| 001 0111 | |

| correctable error vectors | valid codewords | | | | | | | |
|---|---|---|---|---|---|---|---|---|
| 000 0000 | 000 1101 | 001 0111 | 001 1010 | 010 0011 | 010 1110 | 011 0100 | 011 1001 |
| 000 0001 | 000 1100 | 001 0110 | 001 1011 | 010 0010 | 010 1111 | 011 0101 | 011 1000 |
| 000 0010 | 000 1111 | 001 0101 | 001 1000 | 010 0001 | 010 1100 | 011 0110 | 011 1011 |
| 000 0100 | 000 1001 | 001 0011 | 001 1110 | 010 0111 | 010 1010 | 011 0000 | 011 1101 |
| 000 1000 | 000 0101 | 001 1111 | 001 0010 | 010 1011 | 010 0110 | 011 1100 | 011 0001 |
| 001 0000 | 001 1101 | 000 0111 | 000 1010 | 011 0011 | 011 1110 | 010 0100 | 010 1001 |
| 010 0000 | 010 1101 | 011 0111 | 011 1010 | 000 0011 | 000 1110 | 001 0100 | 001 1001 |
| 100 0000 | 100 1101 | 101 0111 | 101 1010 | 110 0011 | 110 1110 | 111 0100 | 111 1001 |

| correctable error vectors | valid codewords | | | | | | | |
|---|---|---|---|---|---|---|---|---|
| 100 0110 | 100 1011 | 101 0001 | 101 1100 | 110 0101 | 110 1000 | 111 0010 | 111 1111 |
| 100 0111 | 100 1010 | 101 0000 | 101 1101 | 110 0100 | 110 1001 | 111 0011 | 111 1110 |
| 100 0100 | 100 1001 | 101 0011 | 101 1110 | 110 0111 | 110 1010 | 111 0000 | 111 1101 |
| 100 0010 | 100 1111 | 101 0101 | 101 1000 | 110 0001 | 110 1100 | 111 0110 | 111 1011 |
| 100 1110 | 100 0011 | 101 1001 | 101 0100 | 110 1101 | 110 0000 | 111 1010 | 111 0111 |
| 101 0110 | 101 1011 | 100 0001 | 100 1100 | 111 0101 | 111 1000 | 110 0010 | 110 1111 |
| 110 0110 | 110 1011 | 111 0001 | 111 1100 | 100 0101 | 100 1000 | 101 0010 | 101 1111 |
| 000 0110 | 000 1011 | 001 0001 | 001 1100 | 010 0101 | 010 1000 | 011 0010 | 011 1111 |

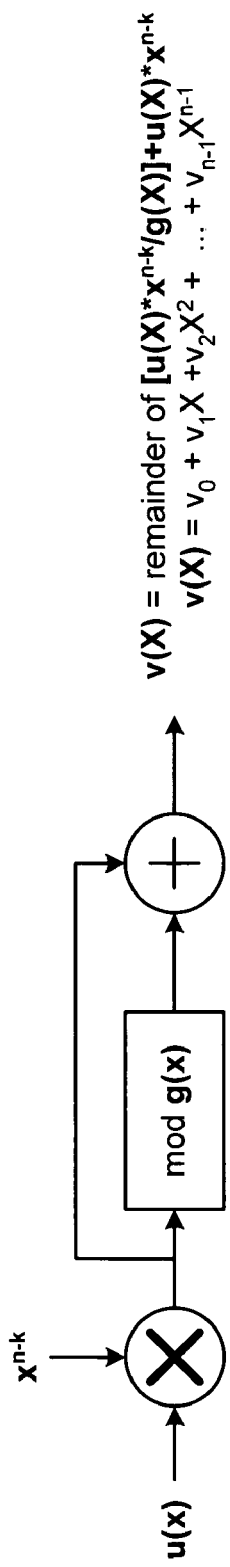

$u(x) = u_0 + u_1 x + u_2 x^2 + \ldots u_{k-1} x^{k-1}$ $v(X) =$ remainder of $[u(X)*x^{n-k}/g(X)] + u(X)*x^{n-k}$
$v(X) = v_0 + v_1 X + v_2 X^2 + \ldots + v_{n-1} X^{n-1}$

FIG. 5
prior art BCH block encoding $n = 7$ and $k = 4$
for $u = 1011$  $u(X) = 1 + x^2 + x^3$
$g(x) = 1 + x + x^3$
$u(x)*x^{n-k} = (1 + x^2 + x^3)*x^3 =$
$x^3 + x^5 + x^6$
remainder of $(x^3 + x^5 + x^6)/(1 + x + x^3)$
$= 1$, therefore
$v(x) = 1 + x^3 + x^5 + x^6$ (i.e., $v = 100\ 1011$)

$n = 7$ and $k = 4$
for $u = 0011$  $u(x) = 0 x^2 + x^3$
$g(x) = 1 + x + x^3$
$u(x)*x^{n-k} = (x^2 + x^3)*x^3 =$
$x^5 + x^6$
remainder of $(x^5 + x^6)/(1 + x + x^3)$
$= x$, therefore
$v(x) = x + x^5 + x^6$ (i.e., $v = 010\ 0011$)

FIG. 6
prior art examples of (7,4) BCH
block encoding prior art BCH decoding prior art syndrome calculation module prior art Chien search module prior art pipelined
BCH decoding BCH decoder 10 modules 14 and 16 odd index processing module 40

BCH decoder 50

BCH decoder 80 pipelined BCH decoding

PARALLEL DECODING OF A BCH ENCODED SIGNAL

BACKGROUND OF THE INVENTION

1. Technical Field of the Invention

This invention relates generally to data communications and more particularly to encoding and decoding of data within such communication systems.

2. Description of Related Art

As is known, communication systems include a plurality of communication devices (e.g., modems, personal computers, laptops, cell phones, radios, telephones, facsimile machines, et cetera) that communicate directly (i.e., point to point) or indirectly via communication system infrastructure (e.g., wire line channels, wireless channels, bridges, switches, routers, gateways, servers, et cetera). As is also known, a communication system may include one or more local area networks and/or one or more wide area networks to support at least one of the Internet, cable services (e.g., modem functionality and television), wireless communication systems (e.g., radio, cellular telephone), satellite services, wire line telephone services, et cetera.

In any type of communication system, information (e.g., voice, audio, video, text, data, et cetera) is transmitted from one communication device to another via the infrastructure. Accordingly, the transmitting communication device prepares the information for transmission to the other device and provides the prepared information to the infrastructure for direct or indirect routing to the receiving communication device. For indirect routing, a piece of infrastructure equipment (e.g., server, router, et cetera) receives the prepared information and forwards it to another piece of infrastructure equipment or to the receiving communication device. The prepared information is thus propagated through the infrastructure until it reaches the receiving communication device. Once received, the receiving communication devices traverses the processing steps used by the transmitting communication device to prepare the information for transmission to recapture the original information.

As is further known, transmission of information between communication devices is not performed in an ideal environment where the received information exactly matches the transmitted information. In practice, the infrastructure introduces error, which distorts the transmitted information such that the received information does not exactly match the transmitted information. To compensate for the error introduced by the infrastructure, the transmitting communication device includes an encoder, which adds redundancy to the original data to make the original data more unique, and the receiving communication device includes a corresponding decoder, which uses the redunancy information to recover the original data from the received data that includes transmission errors.

As is known, there are two general types of coding in common use: block coding and convolution coding. In general, a block coding encoder divides information sequences into message blocks and converts each message block into a code word independently. A convolutional encoder encodes message blocks into a corresponding code word but does so based on previous, in time, message blocks.

As is also known, there are a variety of block coding schemes including linear block encoding, Reed-Solomon encoding, cyclic encoding, and BCH (Bose-Chadhuri-Hocquenghem) encoding, etc. FIG. 1 is a schematic block diagram of a transmitting communication device providing prepared information to a receiving communication device that utilizes BCH encoding. The transmitting communication device includes a data source, channel encoder, and a modulator. The receiving communication device includes a demodulator, channel decoder, and a data destination. The channel represents the communication system infrastructure.

The data source of the transmitting communication unit generates the original information as a series of k-bit data messages (u) that may be represented as polynomials [e.g., $u(x)=u_0x^0+u_1x^1+u_2x^2+\ldots+U_kx^k$]. Depending on the type of transmitting communication device, the data source may generate digitized voice messages, digitized audio messages, digitized video messages, text messages, data messages and/or a combination thereof. The channel encoder receives the k-bit data messages and converts them into n-bit code words (v) [e.g., $u(x)=v_0x^0+v_1x^1+v_2x^2+\ldots+v_nx^n$] based on a polynomial generator [G(x)]. Such BCH encoding will be described in greater detail with reference to FIGS. 5 and 6.

As is known, BCH block codes have unique mathematical properties. For instance, a modulo 2 addition of any two binary codewords yields another valid codeword. Further, only a small subset of available digital values, or vectors in an n dimensional vector space over GF(2), are included in the set of valid codewords, or code block, and have a certain number of bit positions (i.e., polynomial coefficients) that differ from each other codeword. The amount of difference between each valid code word with respect to the overall size of the codeword is generally referred to as a minimum distance ($d_{min}$). The minimum distance indicates how many bits of the received code word can be in error and still accurately decoded to recapture the original information. In general, the number of correctable bits (t) equals the minimum distance minus 1 divided by two [i.e., $t=\frac{1}{2}(d_{min}-1)$].

For systematic encoding, the resulting n-bit codeword (v) includes the k-bit data message (u) and also includes n–k parity message. For BCH encoding, the k-bits of the data message and the n–k parity bits correspond to coefficients of the resulting polynomial codeword [v(x)]. The values of n and k vary depending on the size of the BCH block code. For example, a simple form of BCH block coding has an n of 7 (i.e., the codewords are seventh order polynomials) and a k of 4 (i.e., the data messages are fourth order polynomials). Of course, the values of n and k may increase to relatively large numbers. For example, n may be $2^{14}$ (e.g., 16,384) and k may be 15,368.

As mentioned above, encoding is based on mathematical properties that result is a set of codewords that is a small subset of all possible digital values. For example, as illustrated in FIG. 2, a 7-bit word has 128 different values, yet a (7, 4) [i.e., n=7 and k=4] code block includes only 16 digital values as valid codewords, which are shown in bold in FIG. 2 and summarized in FIG. 3. The first three bits, which are in bit positions 0-2, are the n–k parity bits and the remaining four bits, which are in bit positions 3-6, are the k data message bits. As can be seen, each codeword differs from each other codeword in at least three bit positions. For example, codeword 001 0111 differs from codeword 001 1010 in the third, fourth, and sixth bit positions. Thus, this code block has a minimum distance of three. Accordingly, this code block has one-bit error correcting capabilities (i.e., $t=\frac{1}{2}(3-1)=1$).

FIG. 4 illustrates an example of correctable error vectors (i.e., received words that are not valid codewords but differ from a valid codeword by 1 bit). For example, received digital words 000 0001, 000 0010, 000 0100, 000 1000, 001

0000, 010 0000, and 100 0000 may be corrected to valid codeword 000 0000, since they differ by only one bit from the valid code word 000 0000. As such, as long as the received digital word differs from a valid codeword in t (number of correctable bits) or fewer bit locations, the received word may be accurately decoded to recapture the original data message.

Returning to the discussion of FIG. 1, the modulator modulates the n-bit codeword (v) utilizing a modulation scheme in accordance with one or more standards to which the transmitting communication device is compliant. For example, the modulation may be done in accordance with one or more cable modem standards, wireless communication standards, etc. The modulated code word is then transmitted via a wireline or wireless communication channel to the receiving communication device.

Within the receiving communication unit, the demodulator receives a digital word (r), which corresponds to the transmitted codeword (v) plus any error (e) that was introduced by the channel (or storage element). The demodulator demodulates the received word (r) in accordance with the standard or standards in which the codeword (v) was modulated to produce a demodulated received polynomial r(x).

The channel decoder receives the demodulated received polynomial r(x) and determines whether the received polynomial corresponds to a valid code word, which is typically done by calculating syndrome. Syndrome, which will be described in greater detail with reference to FIGS. 7 and 8, generally corresponds to a remainder value when the received polynomial r(x) is divided by the polynomial generator [g(x)]. When the syndrome is zero, i.e., the remainder was zero, then the received polynomial corresponds to a valid code word. If at least one syndrome values is not zero, i.e., the remainder was not zero, then the received polynomial does not correspond to a valid codeword.

If the received polynomial corresponds to a valid codeword, the codeword is processed to recapture the original data message (u). In practice, for systematically encoded data messages, the original data message is obtained by simply extracting the first k-bits of the valid codeword. The data destination receives the recovered data message and processes it accordingly.

If the received polynomial [r(x)] does not correspond to a valid code word, the channel decoder determines the error introduced by the channel based on the syndrome values. In essence, the determination of the error is determining which one of a plurality of error patterns that produce the same syndrome as the received polynomial [r(x)], is the most likely error pattern, or error polynomial, that distorted the transmitted codeword [v(x)]. Typically, the error pattern of the plurality of error patterns will be the one having the least number of ones. The determination of the error pattern will be described in greater detail with reference to FIGS. 7 and 9.

Having determined the error pattern the channel decoder determines the bit location, or locations, of the received polynomial [r(x)] that are in error based on the error pattern. Once the bit location, or locations, of error are identified, the decoder corrects the received polynomial accordingly to recapture a valid codeword. The recovered data message (u) is extracted from the valid codeword (v) as previously described.

FIG. 5 is a graphical representation of a prior art BCH (Bose-Chaudhuri-Hocquenghem) block encoder. In general, BCH block encoding utilizes a generator polynomial [g(x)] to produce a codeword [v(x)] in a polynomial form. As shown, the data message (u) is treated as a polynomial [u(x)], where the coefficients of the polynomial are the bits of the data message, where $u_0$ is a coefficient for $x^0$, $u_1$ is a coefficient for $x^1$, $u_2$ is a coefficient for $x^2$, ..., and $u_{k-1}$ is a coefficient for $x^{k-1}$. The coefficient of the highest degree of x is transmitted first.

For systematic encoding (i.e., the k-bit data message is included, unaltered and in order, in the resulting codeword with the parity bits), the data message polynomial [u(x)] is multiplied by $x^{n-k}$ to raise the power to correspond to the power of the n-bit codeword polynomial [v(x)]. The resulting product of [u(x)] times $x^{n-k}$ is modulo divided by the generator polynomial [g(x)]. The generator polynomial is the least common multiple of one or more minimal polynomials of $\alpha, \alpha^2, \alpha^3, \ldots, \alpha^{2t}$, where $\alpha$ is a primitive element of the GF(m), with $m=2^n-1$.

The remainder of the modulo division of [u(x)] times $x^{n-k}$ by the generator polynomial [g(x)] is summed with the product of [u(x)] times $x^{n-k}$ to produce the code word polynomial v(x), where $v(x)=v_0+v_1x+v_2x^2+ \ldots +v_{n-1}x^{n-1}$. Accordingly, $v_{n-1}$ corresponds to $u_{k-1}$, $v_{n-2}$ corresponds to $u_{k-2}$, ... $v_{n-k+1}$ corresponds to $u_1$, and $v_{n-k}$ corresponds to $u_0$. Further, $v_{n-k-1}$ corresponds to parity bit $p_{n-k-1}, \ldots, v_1$ corresponds to $p_1$, and $v_0$ corresponds to $p_0$.

FIG. 6 illustrates two prior art examples of a (7, 4) BCH block encoding, where n=7 and k=4. In the first example, a data message of 1011 is converted into a corresponding data message polynomial $u(x)=1+x^2+x^3$. For a (7, 4) single bit correction code block, the polynomial generator $g(x)=1+x+x^3$. The data message polynomial is multiplied by $X^{n-k}$, where n−k equals 3 in this example producing a result of $x^3+x^5+x^6$. This resultant is then divided by $1+x+x^3$, yielding a remainder of 1. Adding the remainder to the product of $u(x)*x^{n-k}$ produces the codeword polynomial $v(x)=1+x^3+x^5+x^6$, which in a linear block binary form corresponds to a codeword of 1001011.

The second example has a data message of 0011, which is converted into a data message polynomial $u(x)=x^2+x^3$. Multiply the data message polynomial by $x^{n-k}$, where n-k equals 3 in this example, yields $x^5+x^6$. Dividing the resulting product by the generator polynomial g(x), which is the same as in the first example, i.e., $1+x+x^3$, produces a remainder of x. Adding the remainder to the product of $u(x)*x^{n-k}$ produces the codeword polynomial $v(x)=x+x^5+x^6$, which in a linear block binary form corresponds to a codeword of 0100001.

FIG. 7 is a schematic block diagram of a prior art BCH decoder that includes a buffer, syndrome calculation module, error locator polynomial module, Chien search module and a subtraction module. The received polynomial r(x) is stored in the buffer and provided to the syndrome calculation module. In general, the syndrome calculation module performs a modulo division of the received polynomial r(x) by the polynomial generator g(x) to produce a plurality of syndrome values s(x). In mathematical terms, the syndrome values are defined as $S_i=R(\alpha^i)$, where R(x) is the remainder polynomial of r(x) mod g(x). If the remainder is 0, then the syndrome is 0, which indicates that the received polynomial r(x) is a valid codeword polynomial. If the remainder is not 0, then the syndrome is not 0, which indicates that the received polynomial r(x) includes error. A more detailed discussion of the syndrome calculation module will be provided with reference to FIG. 8.

The error locator polynomial module, which may perform a Berlekamp-Massey algorithm or Euclid's algorithm, receives the syndrome values and determines an error locator polynomial A(x).

The Chien search module, which will be described in greater detail with reference to FIG. 10, receives the error locator polynomial Λ(x) and determines the location of the error in the received polynomial therefrom. In general, the Chien search module tests potential error locations in succession starting with at a given time and exhausts all possible error locations to determine the actual error locations. After completion of the testing, the error locations are provided to the subtraction module, which removes the error from the received word, yielding a valid codeword polynomial.

FIG. 8 is a schematic block diagram of a prior art syndrome calculation module that produces one of 2t (2 times the number of correctable bits) syndrome values for the prior art BCH decoder. As such, the syndrome calculation module includes a plurality of the circuits shown in FIG. 8 to calculate the syndrome values. As shown, a syndrome value calculation circuit includes an adder, a multiplier and a register. The multiplier is operably coupled to multiple the output of the register (i.e., an intermediate syndrome value) with a primitive element $\alpha^{j+m0}$ (shown as $a^{j+m0}$) of a GF($2^m$). The resulting product is added with the input (i.e., a coefficient of the received polynomial) to produce an intermediate syndrome value, which is stored in the register. As such, for each clock cycle, the degree of the input polynomial r(x) is reduced by one.

For high data rate applications (e.g., in the multiple gigabit-per-second (GBPS) range) that may include a large n, k, and t (i.e., number of bits in the code word, number of bits in the data message, and number of correctable bits), the syndrome calculation module of FIG. 8 has several issues that limit its applicability to lower data rate applications. For instance, the syndrome calculation module may be required to process m symbols per clock cycle, which for high data rate applications requires excessively fast circuitry. For example, if the data rate is 10.7 GBPS and the decoder clock rate is 167.3 MHz, the decoder must process 64 input bits in one clock cycle, which exceeds the processing capabilities of commercially available and economical processors. In addition, the number of multipliers is significant (e.g., 2t=146 for a minimum distance of 147), thus requiring a significant amount of integrated circuit die area. As such, the syndrome calculation module of FIG. 8 would be quite cumbersome and would be too slow for high data rate applications (e.g., data rates in excess of 1 GBPS), which may have large n, k, and t values (e.g., n=$2^{14}$, k=15,368, and t=74).

FIG. 9 is a schematic block diagram of a Chien search module that includes a plurality of multipliers, registers and a summation module, where $\alpha^1$ through $\alpha^t$ are power of the primitive element. In general, the Chien search module receives the coefficients of the error locator polynomial Λ(x) from the error locator polynomial module. The Chien search module uses the Chien search algorithm to test if each time index is a root of the error locator polynomial. If the error locator polynomial is zero for time index i, the error vale is added with the value of the symbol at time index i of the code word. In this configuration, summing the register outputs at index (i) tests whether Λ($\alpha^{-i}$)=0. If so, $\alpha^{-i}$ is a root of the error locator polynomial and indicates an error exists at the indexed location. To test at index i−1 requires multiplying the $k^{th}$ register contents by $\alpha^k$ for all k in $\Lambda^{i-1} = \Lambda_k^i \alpha^k$ and summing the contents again.

This procedure is repeated for each time index until the all of the time indexes have been tested. As such, regardless of whether the received polynomial includes one error or up to t errors, the Chien search module does a complete analysis of the error locator polynomial as just described. Accordingly, the same amount of processing time and power consumption is expended regardless of whether the received polynomial has one error or the maximum allowable.

FIG. 10 is a graphical representation of a prior art pipelined BCH decoding process. As shown, over time, the syndrome module, error locator polynomial module and Chien search module each perform their respective functions. For example, at time T-2, the syndrome module calculates the syndrome for received word number 1. At time T-1, the syndrome module calculates the syndrome for received word number 2, while the error locator polynomial module calculates the error locator polynomial for received word number 1. As shown, for large n and k values, the time to calculate the syndrome is significantly longer than the time to calculate the error locator polynomial. As such, the error locator polynomial module is idle for a substantial portion of time. At time T, the syndrome module calculates the syndrome for a third received word, the error locator polynomial module calculates the error locator polynomial for the second received word, and the Chien search module determines the error location for received word number one. As shown, the Chien search module may perform it function faster than the time it takes to calculate a syndrome. As such, the Chien search module may have idle time. As is known, the Chien search module may not have any idle time if the received code word is uncorrectable, i.e., has more errors than the value of t.

Therefore, a need exists for a method and apparatus of decoding BCH encoded signals for high data rates that minimizes circuitry, minimizes idle time, while maximizing circuitry utilization.

BRIEF SUMMARY OF THE INVENTION

These needs and others are substantially met by the parallel decoding of a BCH encoded signal disclosed herein. In one embodiment, a method or apparatus for parallel decoding of a BCH encoded signal begins by receiving a BCH encoded signal in a binary polynomial format to produce a received polynomial (i.e., r(x)). The processing then continues by converting the received polynomial into a plurality of error identifying polynomials. This may be done during the syndrome calculation time frame of a BCH decoding pipeline process by dividing the received polynomial by the minimum polynomials of $\alpha, \alpha^2, \alpha^3, \ldots, \alpha^{2t-1}$, where remainders of each division corresponds to the plurality of error identifying polynomials. The processing then continues by recursively processing the plurality of binary error identifying polynomials to produce a plurality of error identifying values. This processing may be done during the error locator polynomial identification time frame of a BCH decoding pipeline process by converting the remainder polynomials from GF(2) space into syndrome values in GF($2^m$) space. The processing then continues by processing the plurality of error identifying values to produce an error locator polynomial that represents error in the received polynomial, which may also be done during the error locator polynomial identification time frame of the BCH decoding pipeline process using a Berlekamp-Massey or Euclid algorithm. The processing then continues by evaluating the error locator polynomial to identify the bit location of the error in the BCH encoded signal. This may be done by using a Chien search algorithm during the error location time frame of the BCH decoding pipeline process. The processing then continues by correcting the BCH encoded signal based on the bit location of the error.

The error identification method and apparatus of the present invention simplifies, in comparison with prior art syndrome calculation modules, the design and function of syndrome calculation unit for high data rate BCH decoders. In one embodiment of the present invention, the syndrome calculation module divides the received code words by the minimum polynomials ($\alpha^{m0+1}$, $\alpha^{m0+3}$, $\alpha^{m0+2t-1}$). Since both the received code word polynomial and the minimum polynomials are defined in GF(2), the polynomial divisions are performed in GF((2), such that the syndrome calculation module may include a series of parallel CRC (cyclic redundancy check) circuits, or division circuits. The resulting remainder polynomials are then processed one remainder polynomial at a time (i.e., serially) by the error locator polynomial module and recursively converted to syndrome values in GF($2^m$).

After initializing the registers to one, the recursive processing continues by, for a first one of the plurality of remainder polynomials, multiplying coefficients of the one of the remainder polynomials with a corresponding element of the initialized set of elements to produce a plurality of products. The recursive processing continues by summing the plurality of products with a zero power coefficient of the one of plurality of remainder polynomials to produce a first one of the plurality of odd indexed syndrome components. The recursive processing, for a subsequent one of the plurality of remainder polynomials, continues by multiplying coefficients of the subsequent one of the remainder polynomials with a corresponding set of elements to produce a subsequent plurality of products. The recursive processing continues by summing the subsequent plurality of products with a zero power coefficient of the subsequent one of plurality of remainder polynomials to produce a subsequent one of the plurality of odd indexed syndrome components.

In such an embodiment of a BCH decoder, its architecture balances the complexities within the three primary decoder functions (i.e., syndrome calculation, error locator polynomial calculation and error location determination). In addition, the error locator polynomial module uses fewer clock cycles than the syndrome module and the Chien search module such that, by utilizing an iterative syndrome value conversion circuit in the error locator polynomial module, the idle time of the error locator polynomial module is utilized to calculate the final syndrome values, which significantly reduces gate count in BCH decoder designs. In other words, the computational loading of the three primary decoder functions is more balanced, where some computational loading originally belonging to the syndrome calculation module now belongs to the error locator polynomial module.

BRIEF DESCRIPTION OF THE SEVERAL VIEWS OF THE DRAWINGS

FIGS. 2 and 3 illustrate prior art examples of a 7 by 4 linear code block that includes 16 code words;

FIG. 4 is a graphical representation of correctable error vectors and corresponding valid code words;

FIG. 5 is a schematic block diagram of a prior art BCH block encoder;

FIG. 6 is a graphical representation of examples of (7, 4) BCH encoding;

DETAILED DESCRIPTION OF THE INVENTION

Figure 1:
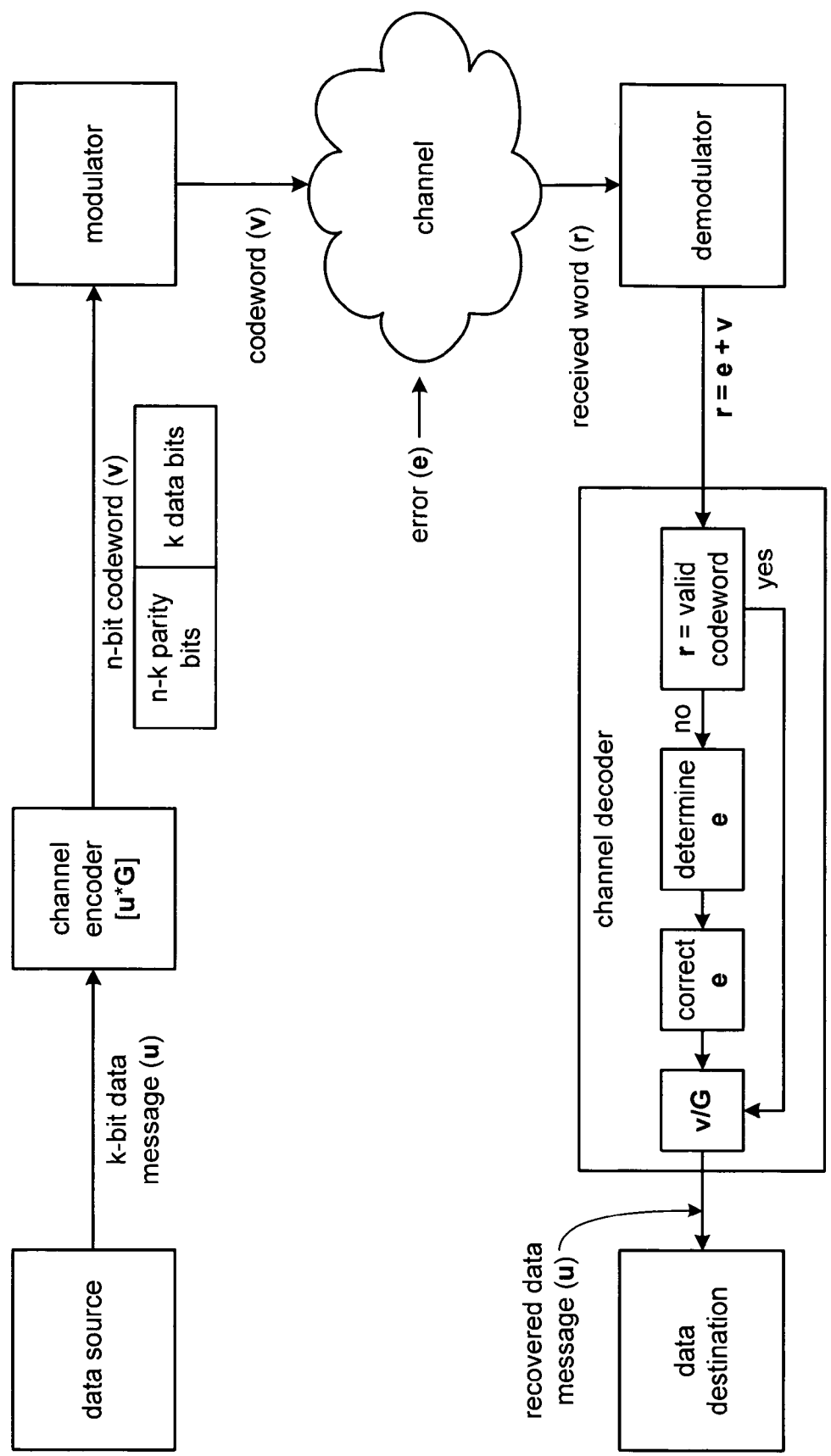
FIG. 1 is a schematic block diagram of a prior art communication devices including channel encoders and channel decoders.
Figure 7:
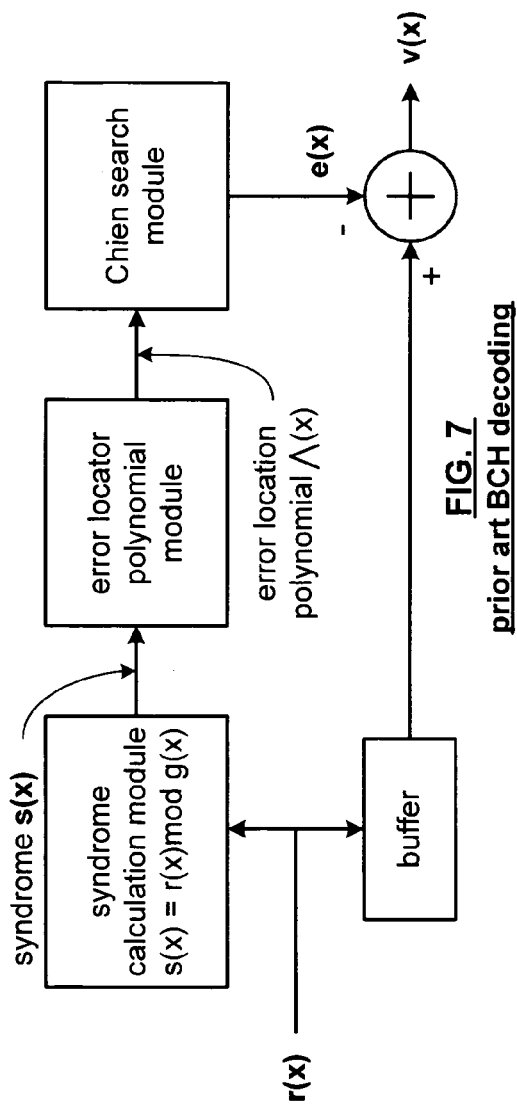
FIG. 7 is a schematic block diagram of a prior art BCH decoder.
Figure 8:
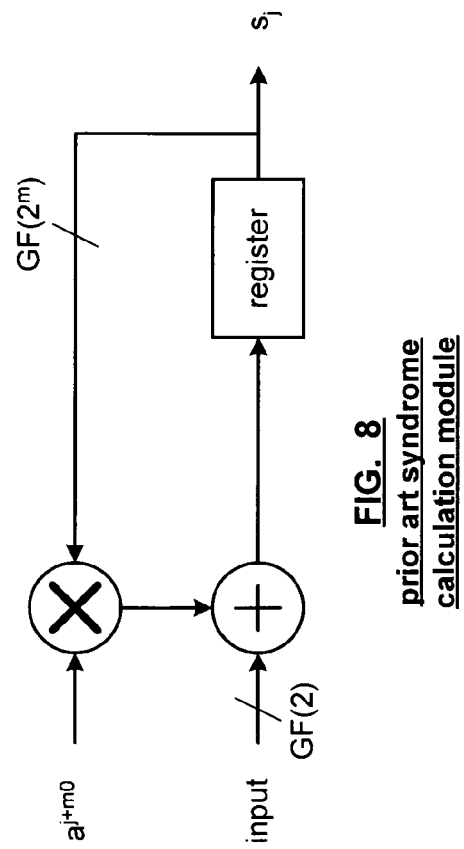
FIG. 8 is a schematic block diagram of a prior art syndrome calculation module.
Figure 9:
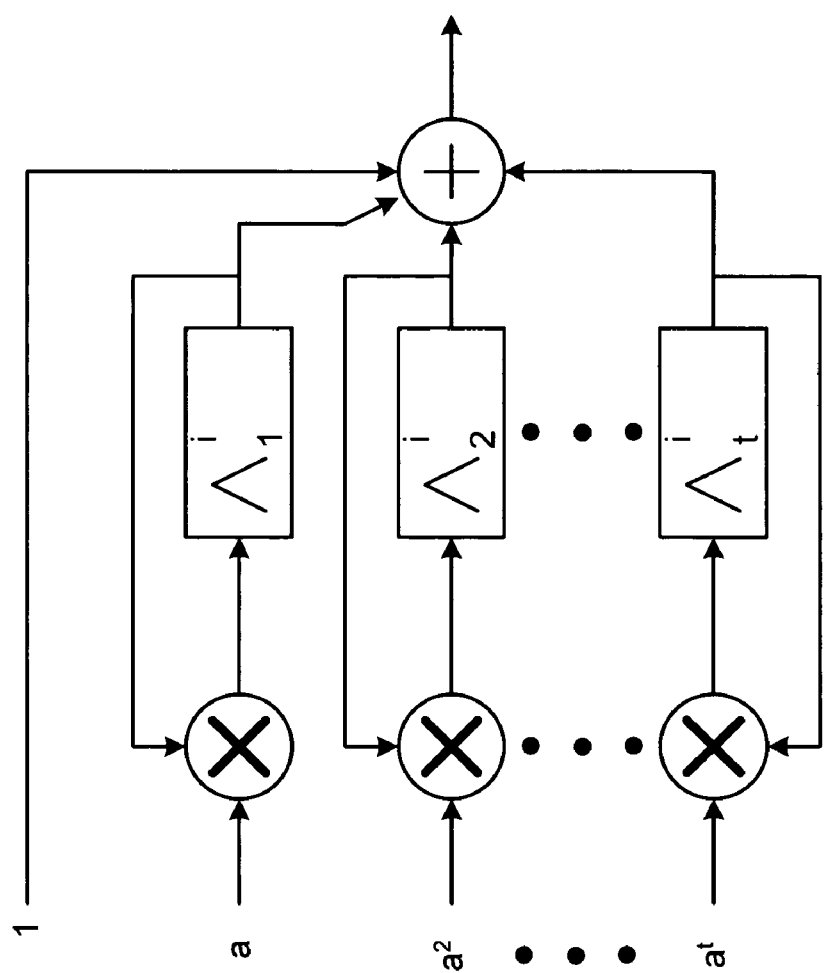
FIG. 9 is a schematic block diagram of a prior art Chien search module.
Figure 10:
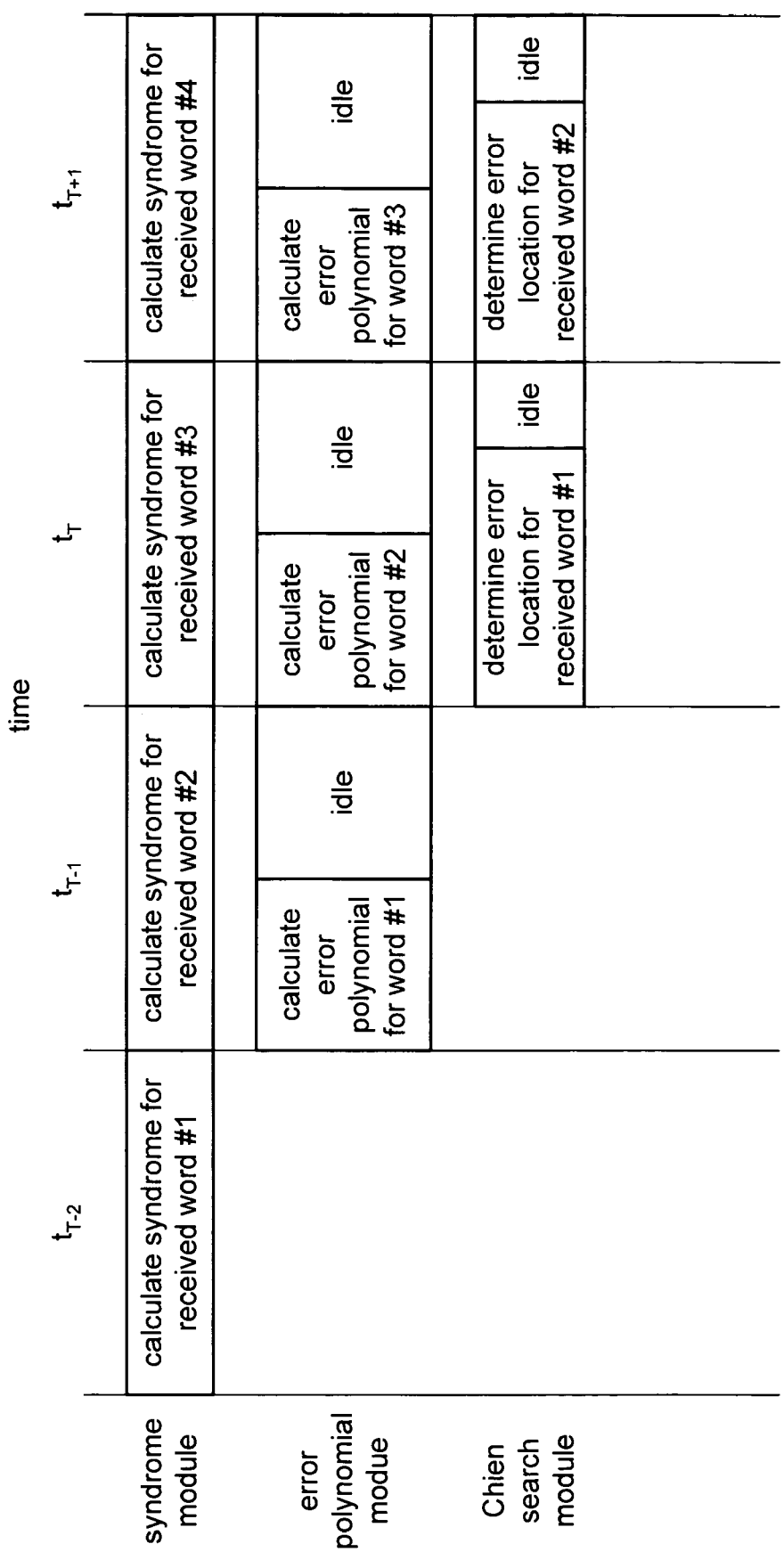
FIG. 10 is a graphical representation of a prior art pipelined BCH decoding process.
Figure 11:
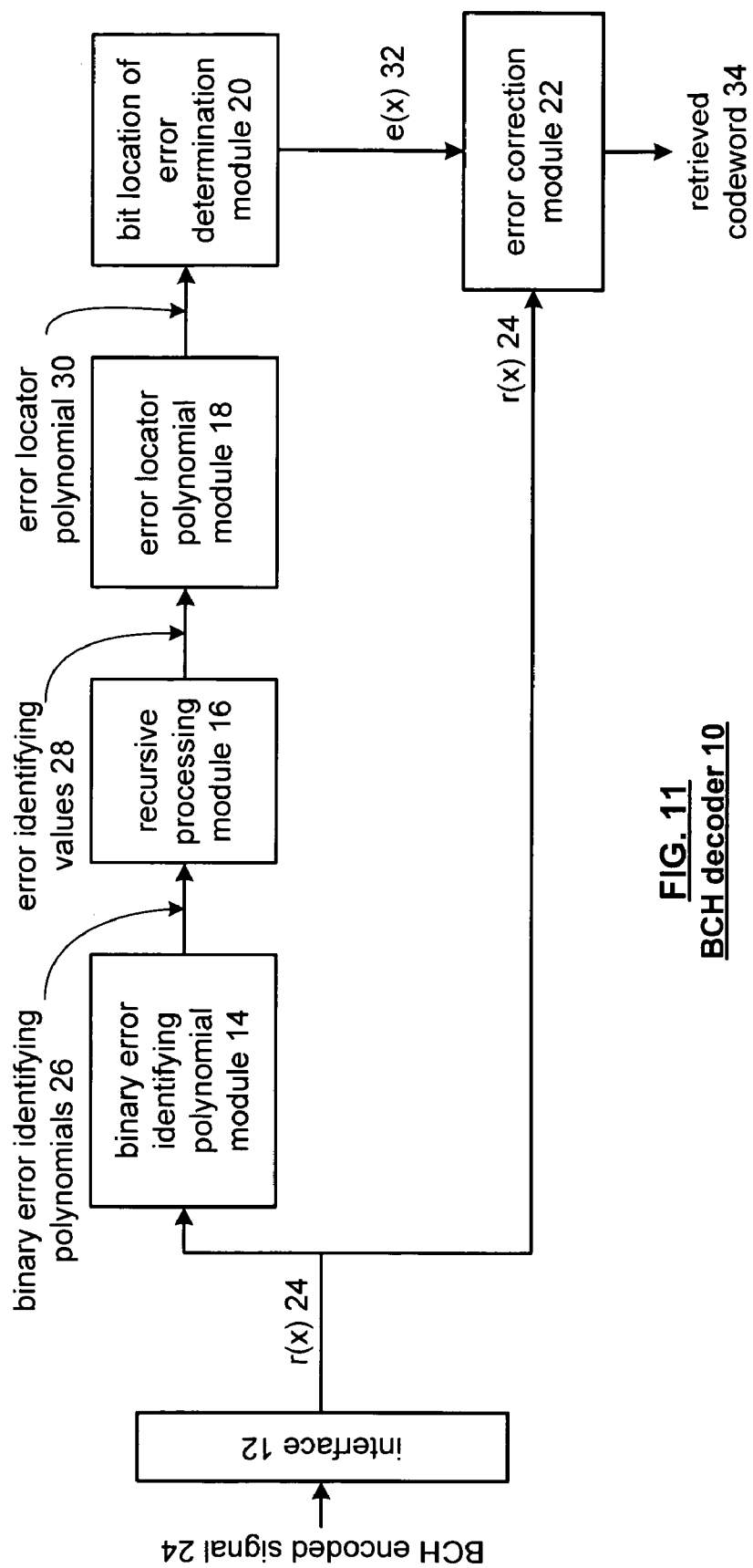
FIG. 11 is a schematic block diagram of a BCH decoder in accordance with the present invention.

FIG. 11 is a schematic block diagram of BCH decoder 10 that includes an interface 12, a binary error identifying polynomial module 14, a recursive processing module 16, an error locator polynomial module 18, a bit location of error determination module 20, and an error correction module 22. The interface 12 is operably coupled to receive a BCH encoded signal 24. In general, the interface 12 may include a demodulator to demodulate an incoming signal to retrieve the baseband representation of a BCH encoded signal 24 [r(x)], may be a serial interface, and/or any other device for receiving a bit stream of data.

The interface 12 provides the BCH encoded signal 24 to the error correction module 22 and to the binary error identifying polynomial module 14. The error correction module 22 corrects bit errors of the received polynomial r(x) 24 based on a corresponding error polynomial e(x) 32 as the error polynomial is received. For binary encoded BCH signals, when the error correction module 22 knows the bit location of the error, it corrects the error by toggling the binary value at the error location (e.g., a logic 1 is toggled to a logic 0 and vice versa.)

The binary error identifying polynomial module 14, which will be described in greater detail with reference to FIG. 12, receives the polynomial 24 and produces therefrom a plurality of binary error identifying polynomials 26. In general, the binary error identifying polynomial module 14 divides the received polynomial 24 by the minimum polynomials, where the number of minimum polynomials is based on the number of correctable bits of a codeword. For example, if t=73, there are 73 correctable bits and the binary error identifying polynomial module 14 will produce 73 binary error identifying polynomials 26. Since both the received polynomial 24 and the minimum polynomials are defined in GF(2), the construct of the binary error identifying polynomial module 14 may be a series of parallel CRC (cyclic redundancy check) circuits, or divider circuits, which are known to one of average skill in the art.

The recursive processing module 16, which will be described in greater detail with reference to FIGS. 12 and 13, receives the binary error identifying polynomials 26 and produces therefrom error identifying values 28. For example, the error identifying values 28 may correspond to syndrome values in the GF($2^m$) domain. By separating the syndrome calculation into generating binary error identifying polynomials and subsequent error identifying values 28, the error identifying polynomials 26 may be determined during the syndrome calculation time period of a pipelined decoder and the corresponding recursive processing to produce the error identifying values 28 may be done in the error locator polynomial time frame of the pipelined decoder.

The error locator polynomial module 18 produces an error locator polynomial 30 from the error identifying values 28. The error locator polynomial module 18 may perform a Euclid algorithm or Berlekamp-Massey algorithm to produce the error locator polynomial. The bit location of error determination module 20 produces an error location 32 from the error locator polynomial 30. In one embodiment, the bit location of error determination module 20 may be implemented utilizing a Chien search module.

Having obtained the corresponding errors for the received word 24, the error correction module corrects the received word 24 based on the errors 32 to produce a retrieved codeword 34. Note that as long as the number of errors within the received encoded signal 24 is less than the number of bits correctable by the decoder, a valid retrieved codeword will be obtained. If the number of bits in error exceeds the capabilities of the decoder, an erroneous codeword will be obtained and an error produced.

Figure 14:
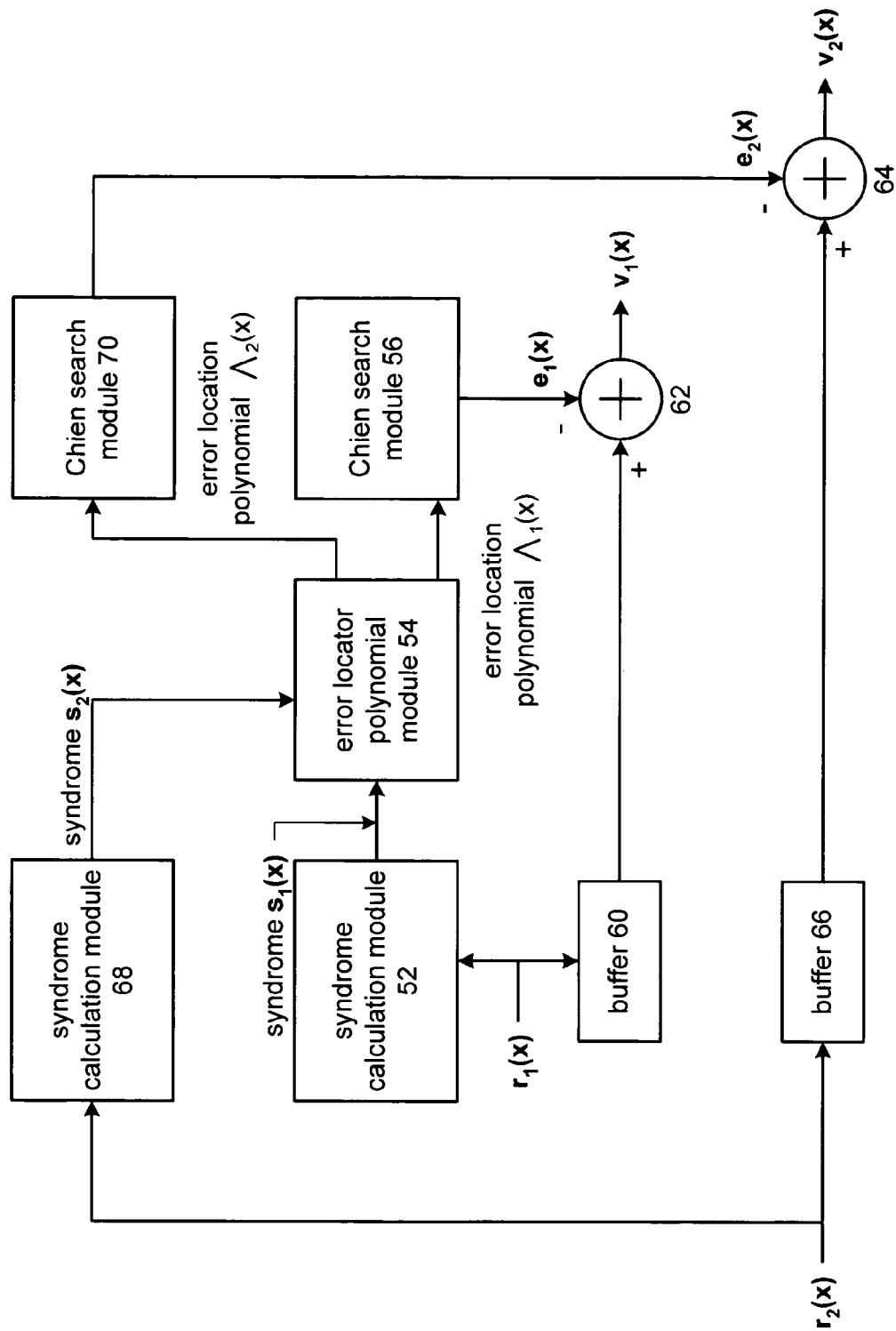
FIG. 14 is a schematic block diagram of an alternate BCH decoder in accordance with the present invention.
Figure 15:
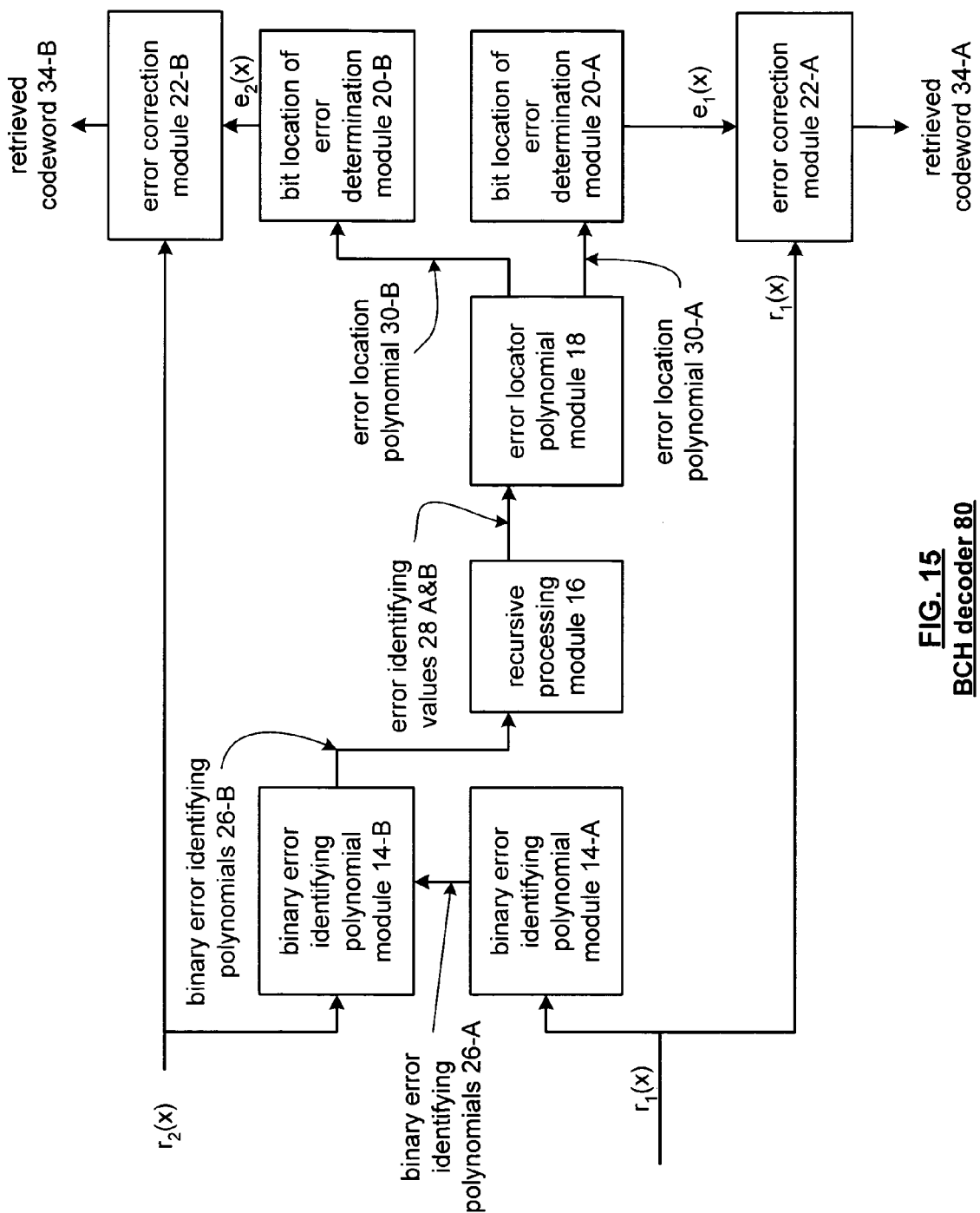
FIG. 15 is a schematic block diagram of another BCH decoder in accordance with the present invention.
Figure 17:
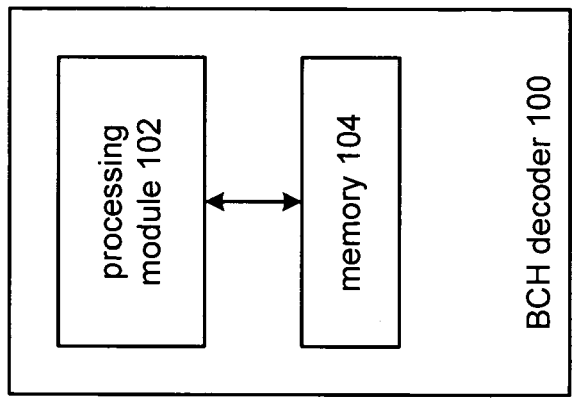
FIG. 17 is a schematic block diagram of yet another BCH decoder in accordance with the present invention.

As one of average skill in the art will appreciate, the decoder 10 of FIG. 11, decoder 50 of FIG. 14, decoder 80 of FIG. 15, and decoder 100 of FIG. 17 may be incorporated in any type of communication device, such as, but not limited to, modems, wireless communication devices, wireline communication devices, storage devices, and/or multimedia processing devices (e.g., receivers, DVD players, televisions, etc.).

Figure 12:
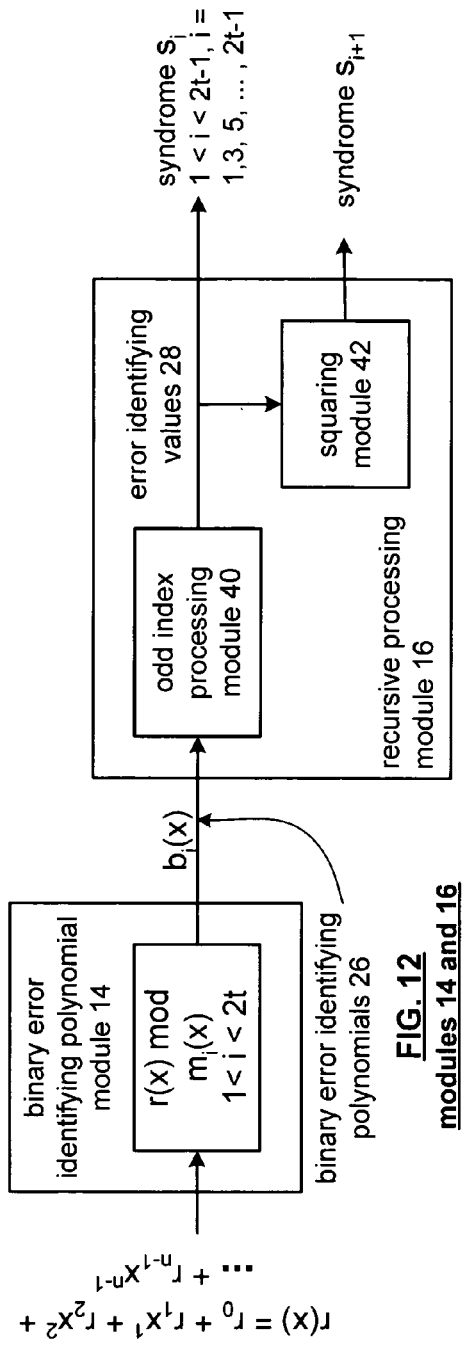
FIG. 12 is a schematic block diagram of the binary error identifying polynomial module and recursive processing module of the decoder of FIG. 11.

FIG. 12 is a schematic block diagram of the binary error identifying polynomial module 14 and the recursive processing module 16. The binary error identifying module 14 includes a plurality of modules, which may be parallel polynomial division modules that are similar to parallel CRC calculation circuits, that perform the function r(x) modulo $m_i(x)$ where i is between 1 and 2t. Recall that t corresponds to the number of bits correctable within a given codeword, where t is determined by the equation ½($d_{min}$–1), where $d_{min}$ is the minimum distance of the code block. Accordingly, the binary error identifying module 14 produces a plurality of binary identifying polynomials 26 [$b_i(x)$].

The recursive processing module 16 includes an odd index processing module 40 and a squaring module 42. Since the conjugates of $\alpha^i$ share the same minimum polynomial, only the syndrome components with odd numbered indexes are calculated, where conjugates of element $\alpha^i$ are $(\alpha^i)^{2^k}$, with k=2, 3, .... The syndrome components with even numbered indexes are calculated with a square calculator in the GF($2^m$) domain when the error locator location polynomial module reads the odd index syndrome components.

Accordingly, the odd index processing module 42 produces the odd indexed syndrome value $S_i$ for odd numbers of i ranging between 1 and 2t–1. The squaring module 42 produces even index syndrome value $S_{i+1}$ based one of previously generated syndrome value (odd or even indexed) To achieve this, the squaring module receives $S_{(i+1)/2}$ as an input, which can be arranged by having the previously generated syndrome values (odd and even indexed) $S_k$, with k=1, 2, ... i–1, available to the recursive processing module 16. The recursive processing module 16 then selects the correct syndrome values to input to squaring module such that the recursive processing module 16 can output the syndromes in a sequential order. In operation, the odd indexed processing module 40 converts the syndrome values $S_1$, $S_3$, ... $S_{2t-1}$ sequentially in t clock cycles. An embodiment of the odd indexed processing module 40 is illustrated in FIG. 13.

Figure 13:
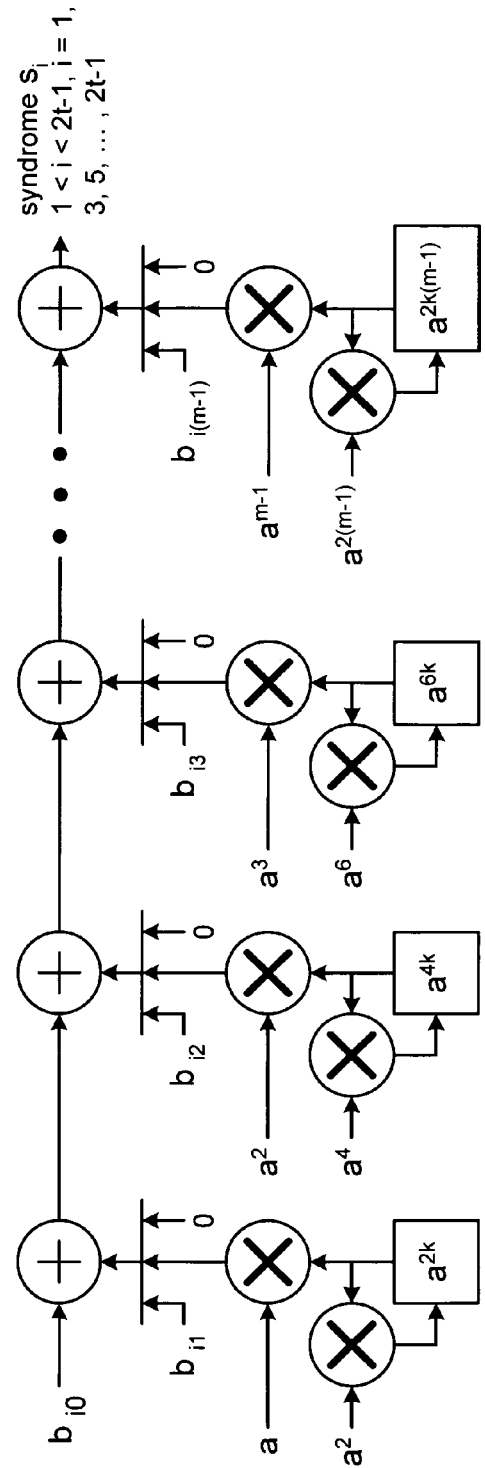
FIG. 13 is a schematic block diagram of the odd index processing module of FIG. 12.

In the odd indexed processing module 40 embodiment of FIG. 13, $b_{i0}$, $b_{i1}$, $b_{i2}$, ..., $b_{i(m-1)}$ are coefficients of one of the remainder polynomials generated by the binary error identifying polynomial module 14. The values of these coefficients are either 0 or 1 since they are in the GF(2) domain. The $\alpha^i$ values (which are shown as "a" in the figure) correspond to the powers of the primitive elements of GF($2^m$). As such, through each incrementation of the recursive processing module, the index of the minimum polynomial is incremented by a value of 2. Accordingly, the sequential processing of syndrome $S_i$ is achieved in a recursive manner.

FIG. 14 is a schematic block diagram of an alternate embodiment of a BCH decoder 50 that includes produce syndrome calculation modules 52 and 68, an error locator polynomial module 54, two Chien search modules 56 and 70, two buffers 60 and 66 and two subtraction modules 62 and 64. In this embodiment, two received words $r_1(x)$ and $r_2(x)$ are received (maybe in an interleaved manner) and simultaneously processed. Accordingly, the syndrome calculation module 52 generates syndrome values $S_1(x)$ for $r_1(x)$ and syndrome calculation module 68 generates syndromes $S_2(x)$ for $r_2(x)$. The first syndrome calculation module 52 provides its calculated syndromes to the second syndrome calculation module 68, which provides the syndromes to the error locator polynomial module 54. The error locator polynomial module 54 processes, in a serial manner, the syndromes to produce a first error locator polynomial and a second error locator polynomial ($\Lambda_1(x)$ and $\Lambda_2(x)$, respectively). Chien search module 56 produces error locations from the first error locator polynomial $\Lambda_1(x)$ while the Chien search module 70 produces the second error location values from the second error locator polynomial $\Lambda_2(x)$. The subtraction module 62 subtracts the first error polynomial $e_1(x)$ from the first received word to produce a first codeword $v_1(x)$. The second subtraction module 64 removes the error as represented by the second error polynomial $e_2(x)$ from the second received word $r_2(x)$ to produce a second valid code word $v_2(x)$. Pipeline processing of the BCH decoder 50 will be described in greater detail with reference to FIG. 16.

FIG. 15 illustrates a schematic block diagram of an alternate BCH decoder 80 that includes two binary error identifying polynomial modules 14A and 14B, a recursive processing module 16, an error locator polynomial module 18, two bit location of error determination modules 20-A and 20-B, and two error correction modules 22-A and 22-B. In this embodiment, the decoder 80 receives two words $r_1$ and $r_2$ (which may be interleaved) and processes them in a parallel and serial manner. For example, the binary error identifying polynomial modules 14A and B operate in parallel on their respective received words as described with reference to FIGS. 11 and 12. The recursive processing module 16 operates in a serial manner on the binary error identifying polynomials 26A and 26B as received from module 14B in a manner as described with reference to FIGS. 11-13. Note that when module 16 finishes processing of the binary identifying polynomials from 26A, the recursive processing circuit may be reset before processing the binary identifying polynomials from 26B.

The error locator polynomial module 18, in a serial fashion, processes the error identifying values 28A and 28B, (which may be syndromes) to produce two error locator polynomials 30-A and 30-B. The bit location of error determination modules 20-A and 20-B, which may be Chien search engines, process the respective error locator polynomials 30-A and 30-B to produce error polynomials $e_1(x)$ and $e_2(x)$. The error correction modules 22-A and 22-B process the received words $r_1(x)$ and $r_2(x)$ with the corresponding error polynomials $e_1(x)$ and $e_2(x)$ to produce retrieved code words 34A and 34B.

Figure 16:
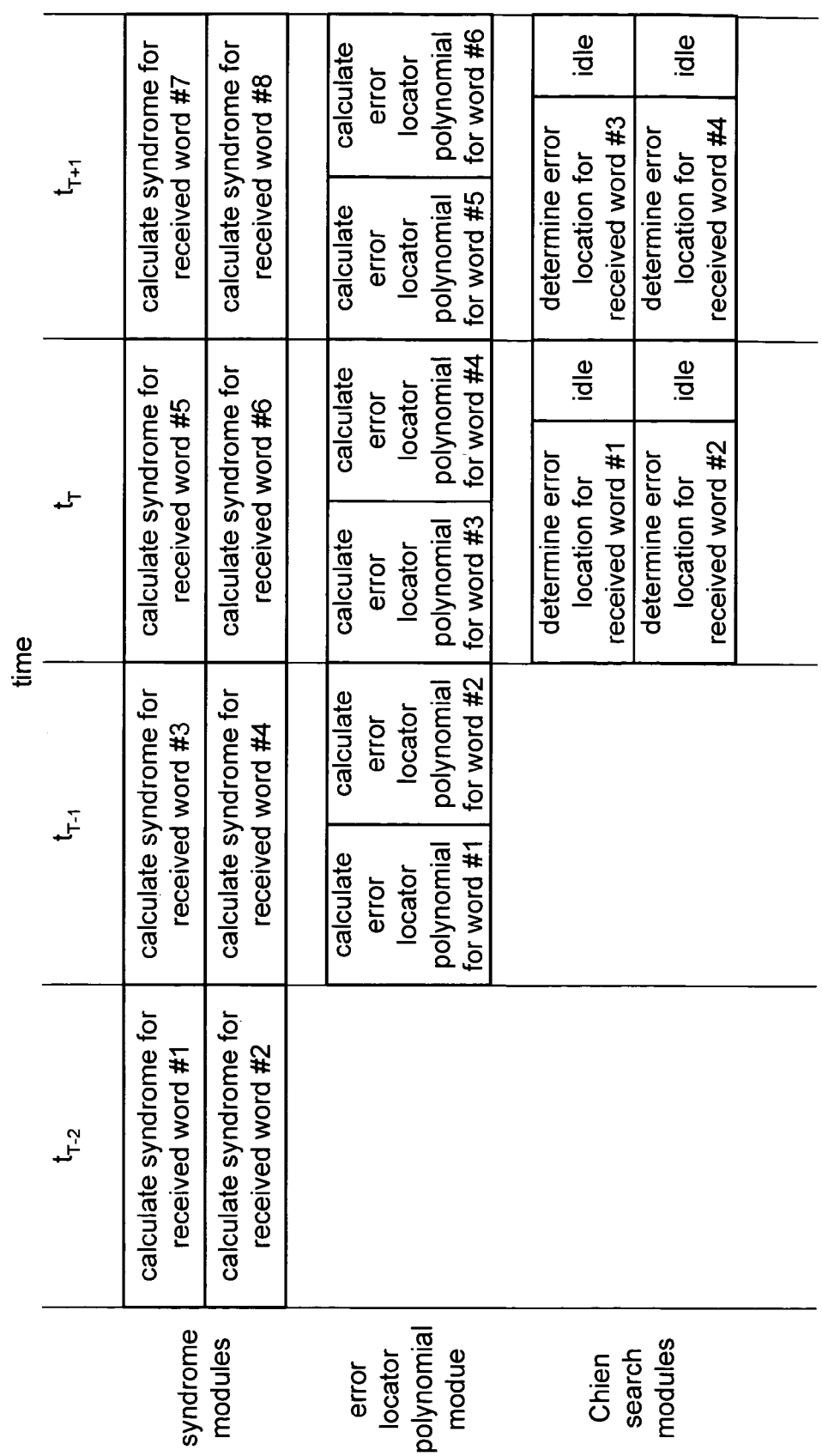
FIG. 16 is a graphical representation of pipeline BCH decoding in accordance with the present invention.

FIG. 16 is a graphical representation of the pipelined BCH decoding process of BCH decoders 10, 50 and/or 80. As shown, during time period T-2, the syndrome modules calculate syndromes for received words number 1 and 2. In the BCH decoders 10 and 80 this corresponds to the binary error identifying polynomial modules generating a plurality of binary error identifying polynomials. For BCH decoder 50, this may entail producing syndrome values.

At time T-1, the syndrome modules calculate in parallel syndromes for received words number 3 and 4. In addition, the error locator polynomial module, which, for decoders 10 and 80, include the recursive processing module 16 and error locator polynomial module 18, calculate error locator polynomials for received words 1 and 2 in a serial fashion. At time T, the syndrome modules calculate syndromes for received words number 5 and 6. In addition, the error locator polynomial module, which may also include the recursive processing module 16, generates error locator polynomials for words 3 and 4 in a serial manner. Further, at time T, the Chien search modules determine error locations for received words 1 and 2. With the pipeline full, at time T+1, syndrome values are calculated for received words 7 and 8. In addition, at time T+1, error locator polynomials are calculated for words 5 and 6 and error locations are determined for words 3 and 4.

FIG. 17 is a schematic block diagram of an alternate BCH decoder 100 and includes processing module 102 and memory 104. The processing module 102 may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 104 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 102 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. The memory 104 stores, and the processing module 102 executes, operational instructions corresponding to at least some of the steps and/or functions illustrated in FIGS. 18-20.

Figure 18:
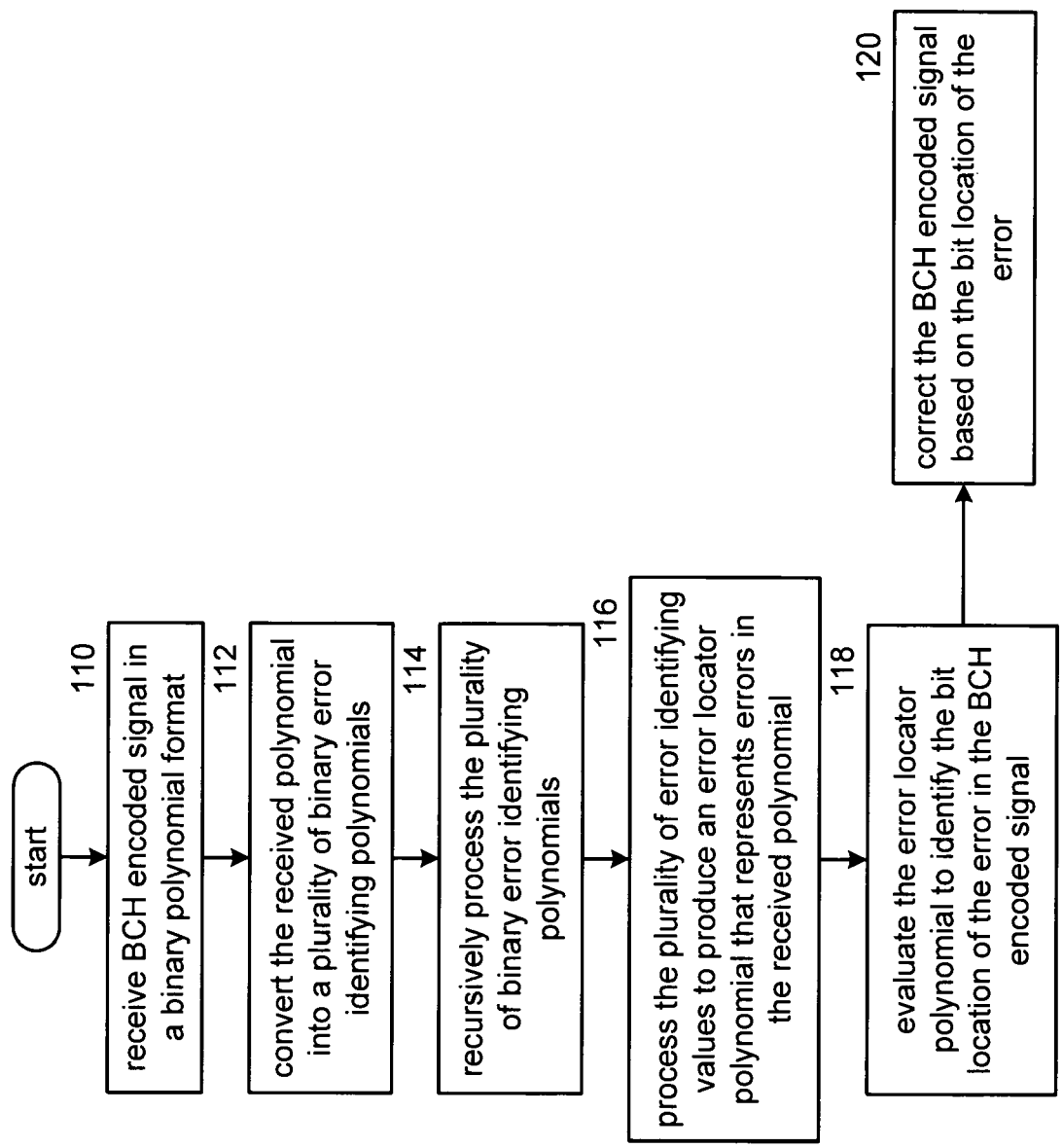
FIG. 18 is a logic diagram of a method for BCH decoding in accordance with the present invention.

FIG. 18 is a logic diagram of a method for decoding a Bose-Chadhuri-Hocquenghem (BCH) encoded signal. The method begins at step 110 where the decoder receives the BCH encoded signal in a binary polynomial format to produce a received polynomial. The method then proceeds to step 112 where the decoder converts the received polynomial into a plurality of binary error identifying polynomials. The converting of the received polynomial into the plurality of binary error identifying polynomials may be done by dividing the received polynomial by a corresponding one of a plurality of minimum polynomials of a, $a^3, \ldots a^{2t-1}$ to obtain a quotient polynomial and a remainder polynomial in a given time interval, wherein the remainder polynomial represents one of the plurality of binary error identifying polynomials.

The method then proceeds to step 114 where the decoder recursively processes the plurality of binary error identifying polynomials to produce a plurality of error identifying values. This may be done by, for each of the plurality of binary error identifying polynomials having an odd index, dividing the received polynomial by a corresponding one of a plurality of minimum polynomials to obtain a quotient polynomial and a remainder polynomial in a given clock cycle, wherein the remainder polynomial represents one of the plurality of binary error identifying polynomials. Next, the plurality of remainder polynomials may be recursively processed to produce a plurality of odd indexed syndrome components of the plurality of error identifying values. The odd indexed syndrome components are then squares to produce a plurality of even indexed syndrome components of the plurality of error identifying values.

The recursive processing of the plurality of odd indexed syndrome components may be done by initializing (e.g., registers in module 16 are set to one) to produce an initialized set of elements. Having initialized the set of elements, the decoder, for a first one of the plurality of remainder polynomials, multiplies coefficients of the one of the remainder polynomials with a corresponding element of the initialized set of elements to produce a plurality of products. The decoder then sums the plurality of products with a zero power coefficient of the one of plurality of remainder polynomials to produce a first one of the plurality of odd indexed syndrome components. Next, the decoder increments the set of elements, i.e., updates the registers in module 16, by multiplying the factors connecting to the registers and storing the products in the registers. For the remaining remainder polynomials, the decoder multiplies coefficients of subsequent ones of the remainder polynomials with a corresponding element of the incremented set of elements to produce a subsequent plurality of products and sums the subsequent plurality of products with a zero power coefficient of the subsequent one of plurality of remainder polynomials to produce a subsequent one of the plurality of odd indexed syndrome components.

The method then continues at step 116 where the decoder processes the plurality of error identifying values (e.g., syndrome values) to produce an error locator polynomial that represents errors in the received polynomial. This may be done by performing a Euclidian algorithm on the plurality of error identifying values or by performing a Berlekamp-Massey algorithm on the plurality of error identifying values to produce the error locator polynomial.

The method then proceeds to step 118, where the decoder evaluates the error locator polynomial to identify the bit location of the error in the BCH encoded signal. This may be done by using a Chien search algorithm. The method then proceeds to step 120 where the decoder corrects the BCH encoded signal based on the bit location of the error.

As one of average skill in the art will appreciate, the decoder may further decode additional received words in a pipelined manner beginning with sequentially receiving a second BCH encoded signal in the binary polynomial format and a third BCH encoded signal in the binary polynomial format to produce a received second polynomial and a received third polynomial, respectively. The decoder may then convert the received third polynomial into a third plurality of binary error identifying polynomials during a given time interval. The decoder may also recursively process a second plurality of binary error identifying polynomials to produce a second plurality of error identifying values during the given time interval, wherein the second plurality of binary error identifying polynomials were generated from the received second polynomial during a previous time interval. The decoder would further process the second plurality of error identifying values to produce an error locator polynomial that represents errors in the received second polynomial during the given time interval. The decoder would also evaluate the error locator polynomial to identify the bit location of the error in the BCH encoded signal during the given time interval and correct the BCH encoded signal based on the bit location of the error during the given time interval.

Figure 19:
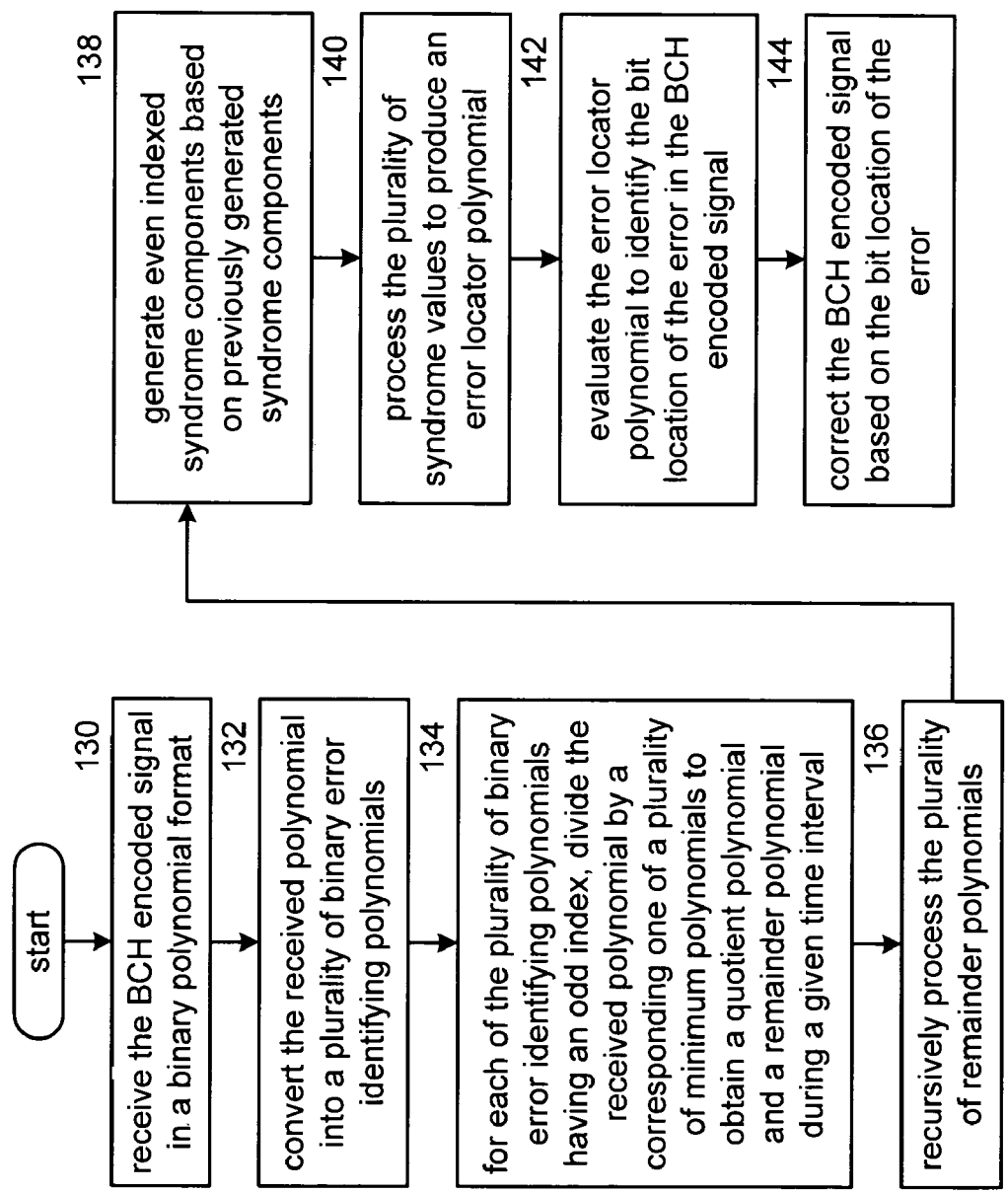
FIG. 19 is a logic diagram of an alternate method for BCH decoding in accordance with the present invention.

FIG. 19 is a logic diagram of a method for decoding a Bose-Chadhuri-Hocquenghem (BCH) encoded signal. The method begins at step 130 where the decoder receiving a BCH encoded signal in a binary polynomial format to produce a received polynomial. The method then proceeds to step 132 where the decoder converts the received polynomial into a plurality of binary error identifying polynomials. The method then proceeds to step 134 where the decoder, for each of the plurality of binary error identifying polynomials having an odd index, divides the received polynomial by a corresponding one of a plurality of minimum polynomials to obtain a quotient polynomial and a remainder polynomial during a given time interval, wherein the remainder polynomial represents one of the plurality of binary error identifying polynomials.

The method then proceeds to step 136 where the decoder recursively processes the plurality of remainder polynomials to produce a plurality of odd indexed syndrome components of a plurality of syndrome values. The method then proceeds to step 138 where the decoder recursively squares one of previously generated syndrome components (% WX no matter odd indexed or even indexed. For example to produce $S_4$ the decoder needs to square $S_2$, and $S_2$ is an even indexed component.) to produce a plurality of even indexed syndrome components of the plurality of syndrome values. The method then proceeds to step 140 where the decoder processes the plurality of syndrome values to produce an error locator polynomial that represents errors in the received polynomial. The method then proceeds to step 142 where the decoder evaluates the error locator polynomial to identify the bit location of the error in the BCH encoded signal and correct the BCH encoded signal based on the bit location of the error.

Figure 20:
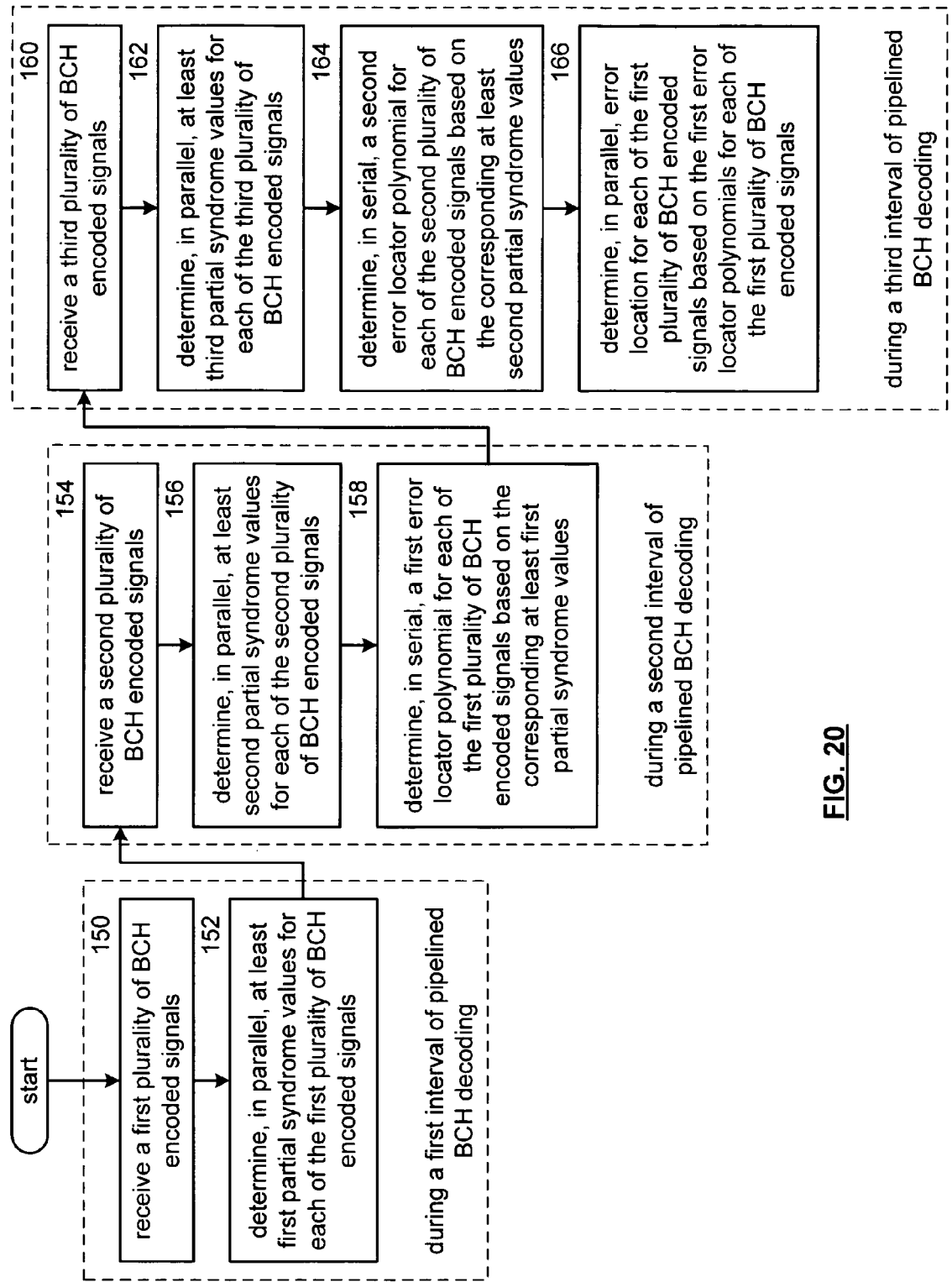
FIG. 20 is a logic diagram of yet another method for BCH decoding in accordance with the present invention.

FIG. 20 is a logic diagram of a method decoding a BCH encoded signal. The method begins at step 150 where the decoder, for during a first interval of pipelined BCH decoding, receives a first plurality of BCH encoded signals (e.g., $r_1(x)$ and $r_2(x)$ of FIG. 14 or 15). Then at step 152, the decoder, during the first interval, determines, in parallel, at least first partial syndrome values (e.g., binary error identifying polynomials or syndrome values) for each of the first plurality of BCH encoded signals.

During a second interval of the pipelined BCH decoding, the method proceeds to step 154 where the decoder receives a second plurality of BCH encoded signals (e.g., two or more code words $r_{1-1}(x)$ and $r_{2-1}(x)$). The method then proceeds to step 156 where the decoder determines, in parallel, at least second partial syndrome values for each of the second plurality of BCH encoded signals. The method then proceeds to step 158 where the decoder determines, in serial, a first error locator polynomial for each of the first plurality of BCH encoded signals based on the corresponding at least first partial syndrome values.

During a third interval of the pipelined BCH decoding, the method proceeds to step 160 where the decoder receiving a third plurality of BCH encoded signals. The process then proceeds to step 162 where the decoder determines, in parallel, at least third partial syndrome values for each of the third plurality of BCH encoded signals. The method then proceeds to step 164 where the decoder determines, in serial, a second error locator polynomial for each of the second plurality of BCH encoded signals based on the corresponding at least second partial syndrome values. The method then proceeds to step 166 where the decoder determines, in parallel, error location for each of the first plurality of BCH encoded signals based on the first error locator polynomials for each of the first plurality of BCH encoded signals.

The preceding discussion has presented a method and apparatus for error identification of a BCH encoded signal. By calculating error identifying polynomials, by utilizing an odd index processing module to calculate odd index syndromes, and by deriving even index syndrome values from previously generated (odd or even indexed) syndrome values, BCH decoding is simplified and speed up, making BCH encoding and decoding viable coding design choices for high-speed integrated circuit data communication devices. As one of average skill in the art will appreciate, other embodiments may be derived from the teachings of the present invention without deviating from the scope of the claims.

What is claimed is:

1. A method for decoding a Bose-Chadhuri-Hocquenghem (BCH) encoded signal, the method comprises:
   receiving the BCH encoded signal in a binary polynomial format to produce a received polynomial;
   converting the received polynomial into a plurality of binary error identifying polynomials;
   recursively processing the plurality of binary error identifying polynomials to produce a plurality of error identifying values, wherein the converting the received polynomial and the recursively processing the plurality of binary error identifying polynomials further includes:
      for each of the plurality of binary error identifying polynomials having an odd index, dividing the received polynomial by a corresponding one of a plurality of minimum polynomials to obtain a quotient polynomial and a remainder polynomial in a given clock cycle, wherein the remainder polynomial represents one of the plurality of binary error identifying polynomials;
      recursively processing the plurality of remainder polynomials to produce a plurality of odd indexed syndrome components of the plurality of error identifying values; and squaring each of the plurality of odd indexed syndrome components to produce a plurality of even indexed syndrome components of the plurality of error identifying values;

processing the plurality of error identifying values to produce an error locator polynomial that represents errors in the received polynomial;

evaluating the error locator polynomial to identify the bit location of the error in the BCH encoded signal; and correcting the BCH encoded signal based on the bit location of the error.

2. The method of claim 1, wherein the recursively processing of the plurality of binary error identifying polynomials having the odd index further comprises:

for the received polynomial:
initializing a set of elements based on a first minimum polynomial of the plurality of minimum polynomials to produce an initialized set of elements;

for a first one of the plurality of remainder polynomials, multiplying coefficients of the one of the remainder polynomials with a corresponding element of the initialized set of elements to produce a plurality of products;

summing the plurality of products with a zero power coefficient of the one of plurality of remainder polynomials to produce a first one of the plurality of odd indexed syndrome components;

incrementing the set of elements based on a subsequent one of the plurality of minimum polynomials to produce an incremented set of elements;

for a subsequent one of the plurality of remainder polynomials, multiplying coefficients of the subsequent one of the remainder polynomials with a corresponding element of the incremented set of elements to produce a subsequent plurality of products; and summing the subsequent plurality of products with a zero power coefficient of the subsequent one of plurality of remainder polynomials to produce a subsequent one of the plurality of odd indexed syndrome components.

3. The method of claim 1, wherein processing of the plurality of error identifying values to produce an error locator polynomial further comprises, at least one of:

performing a Euclidian algorithm on the plurality of error identifying values to produce the error locator polynomial; and performing a Berlekamp-Massey algorithm on the plurality of error identifying values to produce the error locator polynomial.

4. The method of claim 1, wherein the evaluating the error locator polynomial further comprises:
performing a Chien search algorithm.

5. The method of claim 1 further comprises:
sequentially receiving, subsequent to receiving the BCH encoded signal, a second BCH encoded signal in the binary polynomial format and a third BCH encoded signal in the binary polynomial format to produce a received second polynomial and a received third polynomial, respectively;

converting the received third polynomial into a third plurality of binary error identifying polynomials during a given time interval;

recursively processing a second plurality of binary error identifying polynomials to produce a second plurality of error identifying values during the given time interval, wherein the second plurality of binary error identifying polynomials were generated from the received second polynomial during a previous time interval;

processing the second plurality of error identifying values to produce an error locator polynomial that represents errors in the received second polynomial during the given time interval;

evaluating the error locator polynomial to identify the bit location of the error in the BCH encoded signal during the given time interval; and correcting the BCH encoded signal based on the bit location of the error during the given time interval.

6. A method for decoding a Bose-Chadhuri-Hocquenghem (BCH) encoded signal, the method comprises:

receiving the BCH encoded signal in a binary polynomial format to produce a received polynomial;

converting the received polynomial into a plurality of binary error identifying polynomials;

for each of the plurality of binary error identifying polynomials having an odd index, dividing the received polynomial by a corresponding one of a plurality of minimum polynomials to obtain a quotient polynomial and a remainder polynomial during a given time interval, wherein the remainder polynomial represents one of the plurality of binary error identifying polynomials;

recursively processing the plurality of remainder polynomials to produce a plurality of odd indexed syndrome components of a plurality of syndrome values;

squaring each of the plurality of odd indexed syndrome components to produce a plurality of even indexed syndrome components of the plurality of syndrome values;

processing the plurality of syndrome values to produce an error locator polynomial that represents errors in the received polynomial;

sequentially receiving, subsequent to receiving the BCH encoded signal, a second BCH encoded signal in the binary polynomial format and a third BCH encoded signal in the binary polynomial format to produce a received second polynomial and a received third polynomial, respectively;

converting the received third polynomial into a third plurality of binary error identifying polynomials during a given time interval;

recursively processing a second plurality of binary error identifying polynomials to produce a second plurality of syndrome values during the given time interval, wherein the second plurality of binary error identifying polynomials were generated from the received second polynomial during a previous time interval;

processing the second plurality of syndrome values to produce an error locator polynomial that represents errors in the received second polynomial during the given time interval;

evaluating the error locator polynomial to identify the bit location of the error in the BCH encoded signal during the given time interval; and correcting the BCH encoded signal based on the bit location of the error.

7. The method of claim 6, wherein the recursively processing of the plurality of binary error identifying polynomials having the odd index further comprises:

for the received polynomial:
initializing a set of elements based on a first minimum polynomial of the plurality of minimum polynomials to produce an initialized set of elements;

for a first one of the plurality of remainder polynomials, multiplying coefficients of the one of the remainder polynomials with a corresponding element of the initialized set of elements to produce a plurality of products;

summing the plurality of products with a zero power coefficient of the one of plurality of remainder polynomials to produce a first one of the plurality of odd indexed syndrome components;

incrementing the set of elements based on a subsequent one of the plurality of minimum polynomials to produce an incremented set of elements;

for a subsequent one of the plurality of remainder polynomials, multiplying coefficients of the subsequent one of the remainder polynomials with a corresponding element of the incremented set of elements to produce a subsequent plurality of products; and summing the subsequent plurality of products with a zero power coefficient of the subsequent one of plurality of remainder polynomials to produce a subsequent one of the plurality of odd indexed syndrome components.

8. The method of claim 6, wherein processing of the plurality of syndrome values to produce an error locator polynomial further comprises, at least one of:

performing a Euclidian algorithm on the plurality of syndrome values to produce the error locator polynomial; and performing a Berlekamp-Massey algorithm on the plurality of syndrome values to produce the error locator polynomial.

9. The method of claim 6, wherein the evaluating the error locator polynomial further comprises:

performing a Chien search algorithm.

10. An apparatus for decoding a BCH encoded signal, the apparatus comprises:

means for receiving the BCH encoded signal in a binary polynomial format to produce a received polynomial;

means for converting the received polynomial into a plurality of binary error identifying polynomials;

means for recursively processing the plurality of binary error identifying polynomials to produce a plurality of error identifying values, wherein the means for converting the received polynomial and the means for recursively processing the plurality of binary error identifying polynomials further function to:

for each of the plurality of binary error identifying polynomials having an odd index, divide the received polynomial by a corresponding one of a plurality of minimum polynomials to obtain a quotient polynomial and a remainder polynomial in a given clock cycle, wherein the remainder polynomial represents one of the plurality of binary error identifying polynomials;

recursively process the plurality of remainder polynomials to produce a plurality of odd indexed syndrome components of the plurality of error identifying values; and square each of the plurality of odd indexed syndrome components to produce a plurality of even indexed syndrome components of the plurality of error identifying values;

means for processing the plurality of error identifying values to produce an error locator polynomial that represents errors in the received polynomial;

means for evaluating the error locator polynomial to identify the bit location of the error in the BCH encoded signal; and means for correcting the BCH encoded signal based on the bit location of the error.

11. The apparatus of claim 10, wherein the means for converting the received polynomial further functions to:

for each of the plurality of binary error identifying polynomials, divide the received polynomial by a corresponding one of a plurality of minimum polynomials to obtain a quotient polynomial and a remainder polynomial in a given time interval, wherein the remainder polynomial represents one of the plurality of binary error identifying polynomials.

12. The apparatus of claim 11, wherein the means for recursively processing of the plurality of binary error identifying polynomials having the odd index further functions to:

for the received polynomial:
initialize a set of elements based on a first minimum polynomial of the plurality of minimum polynomials to produce an initialized set of elements;

for a first one of the plurality of remainder polynomials, multiply coefficients of the one of the remainder polynomials with a corresponding element of the initialized set of elements to produce a plurality of products;

sum the plurality of products with a zero power coefficient of the one of plurality of remainder polynomials to produce a first one of the plurality of odd indexed syndrome components;

increment the set of elements based on a subsequent one of the plurality of minimum polynomials to produce an incremented set of elements;

for a subsequent one of the plurality of remainder polynomials, multiply coefficients of the subsequent one of the remainder polynomials with a corresponding element of the incremented set of elements to produce a subsequent plurality of products; and sum the subsequent plurality of products with a zero power coefficient of the subsequent one of plurality of remainder polynomials to produce a subsequent one of the plurality of odd indexed syndrome components.

13. The apparatus of claim 10, wherein the means for processing of the plurality of error identifying values to produce an error locator polynomial further comprises, at least one of:

a Euclidian algorithm to produce the error locator polynomial from the plurality of error identifying values; and a Berlekamp-Massey algorithm to produce the error locator polynomial from the plurality of error identifying values.

14. The apparatus of claim 10, wherein the means for evaluating the error locator polynomial further comprises:

a Chien search algorithm.

15. The apparatus of claim 10 further comprises:

the means for receiving further functions to sequentially receive, subsequent to receiving the BCH encoded signal, a second BCH encoded signal in the binary polynomial format and a third BCH encoded signal in the binary polynomial format to produce a received second polynomial and a received third polynomial, respectively;

the means for converting further functions to convert the received third polynomial into a third plurality of binary error identifying polynomials during a given time interval;

the means for recursively processing further functions to recursively process a second plurality of binary error identifying polynomials to produce a second plurality of error identifying values during the given time interval, wherein the second plurality of binary error identifying polynomials were generated from the received second polynomial during a previous time interval;

the means for processing further functions to process the second plurality of error identifying values to produce an error locator polynomial that represents errors in the received second polynomial during the given time interval;

the means for evaluating further functions to evaluate the error locator polynomial to identify the bit location of the error in the BCH encoded signal during the given time interval; and the means for correcting further functions to correct the BCH encoded signal based on the bit location of the error during the given time interval.

16. An apparatus for decoding a BCH encoded signal, the apparatus comprises:

means for receiving the BCH encoded signal in a binary polynomial format to produce a received polynomial;

means for converting the received polynomial into a plurality of binary error identifying polynomials;

for each of the plurality of binary error identifying polynomials having an odd index, means for dividing the received polynomial by a corresponding one of a plurality of minimum polynomials to obtain a quotient polynomial and a remainder polynomial during a given time interval, wherein the remainder polynomial represents one of the plurality of binary error identifying polynomials;

means for recursively processing the plurality of remainder polynomials to produce a plurality of odd indexed syndrome components of a plurality of syndrome values;

means for squaring each of the plurality of odd indexed syndrome components to produce a plurality of even indexed syndrome components of the plurality of syndrome values;

means for processing the plurality of syndrome values to produce an error locator polynomial that represents errors in the received polynomial;

means for evaluating the error locator polynomial to identify the bit location of the error in the BCH encoded signal; and means for correcting the BCH encoded signal based on the bit location of the error.

17. The apparatus of claim 16, wherein the means for recursively processing of the plurality of binary error identifying polynomials having the odd index further functions to:

for the received polynomial:

initialize a set of elements based on a first minimum polynomial of the plurality of minimum polynomials to produce an initialized set of elements;

for a first one of the plurality of remainder polynomials, multiply coefficients of the one of the remainder polynomials with a corresponding element of the initialized set of elements to produce a plurality of products;

sum the plurality of products with a zero power coefficient of the one of plurality of remainder polynomials to produce a first one of the plurality of odd indexed syndrome components;

increment the set of elements based on a subsequent one of the plurality of minimum polynomials to produce an incremented set of elements;

for a subsequent one of the plurality of remainder polynomials, multiply coefficients of the subsequent one of the remainder polynomials with a corresponding element of the incremented set of elements to produce a subsequent plurality of products; and sum the subsequent plurality of products with a zero power coefficient of the subsequent one of plurality of remainder polynomials to produce a subsequent one of the plurality of odd indexed syndrome components.

18. The apparatus of claim 16, wherein the means for processing of the plurality of syndrome values to produce an error locator polynomial further comprises, at least one of:

a Euclidian algorithm to produce the error locator polynomial from the plurality of syndrome values; and a Berlekamp-Massey algorithm to produce the error locator polynomial from the plurality of syndrome values.

19. The apparatus of claim 16, wherein the means for evaluating the error locator polynomial further comprises:

a Chien search algorithm.

20. The apparatus of claim 16 further comprises:

the means for receiving further functions to sequentially receive, subsequent to receiving the BCH encoded signal, a second BCH encoded signal in the binary polynomial format and a third BCH encoded signal in the binary polynomial format to produce a received second polynomial and a received third polynomial, respectively;

the means for converting further functions to convert the received third polynomial into a third plurality of binary error identifying polynomials during a given time interval;

the means for recursively processing and the means for squaring further function to process a second plurality of binary error identifying polynomials to produce a second plurality of error identifying values during the given time interval, wherein the second plurality of binary error identifying polynomials were generated from the received second polynomial during a previous time interval;

the means for processing further functions to process the second plurality of syndrome values to produce an error locator polynomial that represents errors in the received second polynomial during the given time interval;

the means for evaluating further functions to evaluate the error locator polynomial to identify the bit location of the error in the BCH encoded signal during the given time interval; and the means for correcting further functions to correct the BCH encoded signal based on the bit location of the error during the given time interval.

21. A method for pipelined decoding a BCH encoded signal, the method comprises:

during a first interval of pipelined BCH decoding:

receiving a first plurality of BCH encoded signals;

determining, in parallel, at least first partial syndrome values for each of the first plurality of BCH encoded signals;

during a second interval of the pipelined BCH decoding:

receiving a second plurality of BCH encoded signals;

determining, in parallel, at least second partial syndrome values for each of the second plurality of BCH encoded signals;

determining, in serial, a first error locator polynomial for each of the first plurality of BCH encoded signals based on the corresponding at least first partial syndrome values;

during a third interval of the pipelined BCH decoding:
receiving a third plurality of BCH encoded signals;
determining, in parallel, at least third partial syndrome values for each of the third plurality of BCH encoded signals;
determining, in serial, a second error locator polynomial for each of the second plurality of BCH encoded signals based on the corresponding at least second partial syndrome values; and
determining, in parallel, error location for each of the first plurality of BCH encoded signals based on the first error locator polynomials for each of the first plurality of BCH encoded signals.

22. The method of claim 21, wherein the determining the at least first, second, and third partial syndrome values further comprises:

for each of the first, second, and third plurality of BCH encoded signals:
converting the each of the first, second, and third plurality of BCH encoded signals into a plurality of error identifying polynomials; and
recursively processing the plurality of error identifying polynomials to obtain a plurality of syndrome values.

23. The method of claim 22, wherein the converting the each of the first, second, and third plurality of BCH encoded signals further comprises:

dividing the each of the first, second, and third plurality of BCH encoded signals by a plurality of minimum polynomials of a generator polynomial to obtain a plurality of quotient polynomials and a plurality of remainder polynomials, wherein the plurality of remainder polynomials represents the plurality of error identifying polynomials.

24. The method of claim 23, wherein the recursively processing of the plurality of error identifying polynomials having the odd index further comprises:

for the each of the first, second, and third plurality of BCH encoded signals:
initializing a set of elements based on a first minimum polynomial of the plurality of minimum polynomials to produce an initialized set of elements;
for a first one of the plurality of remainder polynomials, multiplying coefficients of the one of the remainder polynomials with a corresponding element of the initialized set of elements to produce a plurality of products;
summing the plurality of products with a zero power coefficient of the one of plurality of remainder polynomials to produce a first one of the plurality of odd indexed syndrome components;
incrementing the set of elements based on a subsequent one of the plurality of minimum polynomials to produce an incremented set of elements;
for a subsequent one of the plurality of remainder polynomials, multiplying coefficients of the subsequent one of the remainder polynomials with a corresponding element of the incremented set of elements to produce a subsequent plurality of products; and
summing the subsequent plurality of products with a zero power coefficient of the subsequent one of plurality of remainder polynomials to produce a subsequent one of the plurality of odd indexed syndrome components.

25. The method of claim 22, wherein the converting the each of the first, second, and third plurality of BCH encoded signals and the recursively processing the plurality of error identifying polynomials further comprise:

dividing the each of the first, second, and third plurality of BCH encoded signals having an odd index by a plurality of minimum polynomials of a generator polynomial to obtain a plurality of quotient polynomials and a plurality of remainder polynomials, wherein the plurality of remainder polynomials represents the plurality of error identifying polynomials;
recursively processing the plurality of remainder polynomials to produce a plurality of odd indexed syndrome components of the plurality of syndrome values; and
squaring each of the plurality of odd indexed syndrome components to produce a plurality of even indexed syndrome components of the plurality of syndrome values.

26. The method of claim 21, wherein the determining the first and second error locator polynomials further comprises, at least one of:

performing a Euclidian algorithm on the at least first and second partial syndrome values to produce the first and second error locator polynomials, respectively; and
performing a Berlekamp-Massey algorithm on the at least first and second partial syndrome values to produce the first and second error locator polynomials, respectively.

27. The method of claim 21, wherein the determining the error location further comprises:

performing a Chien search algorithm.

28. An apparatus for pipelined decoding a BCH encoded signal, the apparatus comprises:

processing module; and
memory operably coupled to the processing module, wherein the memory includes operational instructions that cause the processing module to:
during a first interval of pipelined BCH decoding:
receive a first plurality of BCH encoded signals;
determine, in parallel, at least first partial syndrome values for each of the first plurality of BCH encoded signals;
during a second interval of the pipelined BCH decoding:
receive a second plurality of BCH encoded signals;
determine, in parallel, at least second partial syndrome values for each of the second plurality of BCH encoded signals;
determine, in serial, a first error locator polynomial for each of the first plurality of BCH encoded signals based on the corresponding at least first partial syndrome values;
during a third interval of the pipelined BCH decoding:
receive a third plurality of BCH encoded signals;
determine, in parallel, at least third partial syndrome values for each of the third plurality of BCH encoded signals;
determine, in serial, a second error locator polynomial for each of the second plurality of BCH encoded signals based on the corresponding at least second partial syndrome values; and
determine, in parallel, error location for each of the first plurality of BCH encoded signals based on the first error locator polynomials for each of the first plurality of BCH encoded signals.

29. The apparatus of claim 28, wherein the memory further comprises operational instructions that cause the processing module to determine the at least first, second, and third partial syndrome values by:
  for each of the first, second, and third plurality of BCH encoded signals:
    converting the each of the first, second, and third plurality of BCH encoded signals into a plurality of error identifying polynomials; and
    recursively processing the plurality of error identifying polynomials to obtain a plurality of syndrome values.

30. The apparatus of claim 29, wherein the memory further comprises operational instructions that cause the processing module to convert the each of the first, second, and third plurality of BCH encoded signals by:
  dividing the each of the first, second, and third plurality of BCH encoded signals by a plurality of minimum polynomials of a generator polynomial to obtain a plurality of quotient polynomials and a plurality of remainder polynomials, wherein the plurality of remainder polynomials represents the plurality of error identifying polynomials.

31. The apparatus of claim 29, wherein the memory further comprises operational instructions that cause the processing module to convert the each of the first, second, and third plurality of BCH encoded signals and the recursively processing the plurality of error identifying polynomials by:
  dividing the each of the first, second, and third plurality of BCH encoded signals having an odd index by a plurality of minimum polynomials of a generator polynomial to obtain a plurality of quotient polynomials and a plurality of remainder polynomials, wherein the plurality of remainder polynomials represents the plurality of error identifying polynomials;
  recursively processing the plurality of remainder polynomials to produce a plurality of odd indexed syndrome components of the plurality of syndrome values; and
  squaring each of the plurality of odd indexed syndrome components to produce a plurality of even indexed syndrome components of the plurality of syndrome values.

32. The apparatus of claim 31, wherein the memory further comprises operational instructions that cause the processing module to recursively process of the plurality of error identifying polynomials having the odd index by:
  for the each of the first, second, and third plurality of BCH encoded signals:
    initializing a set of elements based on a first minimum polynomial of the plurality of minimum polynomials to produce an initialized set of elements;
    for a first one of the plurality of remainder polynomials, multiplying coefficients of the one of the remainder polynomials with a corresponding element of the initialized set of elements to produce a plurality of products;
    summing the plurality of products with a zero power coefficient of the one of plurality of remainder polynomials to produce a first one of the plurality of odd indexed syndrome components;
    incrementing the set of elements based on a subsequent one of the plurality of minimum polynomials to produce an incremented set of elements;
    for a subsequent one of the plurality of remainder polynomials, multiplying coefficients of the subsequent one of the remainder polynomials with a corresponding element of the incremented set of elements to produce a subsequent plurality of products; and
    summing the subsequent plurality of products with a zero power coefficient of the subsequent one of plurality of remainder polynomials to produce a subsequent one of the plurality of odd indexed syndrome components.

33. The apparatus of claim 28, wherein the memory further comprises operational instructions that cause the processing module to determine the first and second error locator polynomials by, at least one of:
  performing a Euclidian algorithm on the at least first and second partial syndrome values to produce the first and second error locator polynomials, respectively; and
  performing a Berlekamp-Massey algorithm on the at least first and second partial syndrome values to produce the first and second error locator polynomials, respectively.

34. The apparatus of claim 28, wherein the memory further comprises operational instructions that cause the processing module to determine the error location by:
  performing a Chien search algorithm.

* * * * *